United States Patent
Hsieh et al.

(10) Patent No.: US 12,380,945 B2
(45) Date of Patent: *Aug. 5, 2025

(54) MEMORY DEVICE WITH WORD LINE PULSE RECOVERY

(71) Applicant: Taiwan Semiconductor Manufacturing Company, Ltd., Hsinchu (TW)

(72) Inventors: Wei-jer Hsieh, Hsinchu (TW); Yu-Hao Hsu, Tainan (TW); Zhi-Hao Chang, Hsinchu (TW); Cheng Hung Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/417,325

(22) Filed: Jan. 19, 2024

(65) Prior Publication Data

US 2024/0161822 A1     May 16, 2024

Related U.S. Application Data

(63) Continuation of application No. 17/743,073, filed on May 12, 2022, now Pat. No. 11,915,746, which is a
(Continued)

(51) Int. Cl.
*G11C 11/419*     (2006.01)
(52) U.S. Cl.
CPC .............................. *G11C 11/419* (2013.01)

(58) Field of Classification Search
CPC ........................................................ G11C 11/419
(Continued)

(56) References Cited

U.S. PATENT DOCUMENTS 9,111,595 B2    8/2015   Hsu et al.
9,208,841 B2 *   12/2015   Tao ........................ G11C 11/419
(Continued)

FOREIGN PATENT DOCUMENTS

TW         I474336 B      2/2015
TW       202001904 A      1/2020

OTHER PUBLICATIONS

Non-Final Office Action on U.S. Appl. No. 17/002,473 DTD Sep. 20, 2021.
(Continued)

*Primary Examiner* — Sung Il Cho
(74) *Attorney, Agent, or Firm* — FOLEY & LARDNER LLP

(57) ABSTRACT

A memory device includes a plurality of memory cells; a word line, connected to one of the plurality of memory cells, that is configured to provide a first WL pulse having a rising edge and a falling edge that define a pulse width of the first WL pulse; a first tracking WL, formed adjacent to the memory cells, that is configured to provide, via being physically or operatively coupled to a bit line (BL) configured to write a logic state to the memory cell, a second WL pulse having a rising edge with a decreased slope; and a first tracking BL, configured to emulate the BL, that is coupled to the first tracking WL such that the pulse width of the first WL pulse is increased based on the decreased slope of the rising edge of the second WL pulse.

20 Claims, 21 Drawing Sheets

Related U.S. Application Data continuation of application No. 17/002,473, filed on Aug. 25, 2020, now Pat. No. 11,355,183.

(58) Field of Classification Search
USPC .................................................. 365/189.16
See application file for complete search history.

(56) References Cited

U.S. PATENT DOCUMENTS

| | | |
|---|---|---|
| 9,990,985 B1 | 6/2018 | Hsu et al. |
| 2009/0290446 A1* | 11/2009 | Cheng ................... G11C 11/18 365/233.1 |
| 2012/0307574 A1 | 12/2012 | Cheng et al. |
| 2012/0327727 A1 | 12/2012 | Wang |
| 2013/0088926 A1* | 4/2013 | Tao ........................ G11C 7/10 365/191 |
| 2013/0148438 A1 | 6/2013 | Chen |
| 2013/0215693 A1* | 8/2013 | Tao ................. G11C 29/50012 365/194 |
| 2013/0242678 A1* | 9/2013 | Wang ...................... G11C 7/12 365/191 |
| 2013/0329505 A1* | 12/2013 | Yang ..................... G11C 7/227 365/189.11 |
| 2014/0029366 A1 | 1/2014 | Trivedi et al. |
| 2014/0032871 A1* | 1/2014 | Hsu ....................... G11C 7/222 711/E12.001 |
| 2014/0036580 A1* | 2/2014 | Yang ....................... G11C 7/04 365/156 |
| 2014/0036608 A1 | 2/2014 | Chiu et al. |
| 2014/0241077 A1* | 8/2014 | Katoch ................. G11C 7/227 365/189.011 |
| 2014/0269141 A1 | 9/2014 | Hsu et al. |
| 2015/0078110 A1* | 3/2015 | Hong ...................... G11C 7/08 365/194 |
| 2015/0277770 A1* | 10/2015 | Tsai ..................... G06F 3/0604 711/104 |
| 2015/0348598 A1 | 12/2015 | Wang et al. |
| 2018/0144780 A1 | 5/2018 | Kwon et al. |
| 2019/0057735 A1* | 2/2019 | Akkur .................. G06F 30/392 |
| 2019/0392889 A1 | 12/2019 | Trivedi et al. |
| 2020/0294564 A1* | 9/2020 | Baek .................... G11C 11/419 |
| 2020/0294580 A1 | 9/2020 | Raj et al. |

OTHER PUBLICATIONS

Non-Final Office Action on U.S. Appl. No. 17/743,073 DTD Feb. 8, 2023.

Non-Final Office Action on U.S. Appl. No. 17/743,073 DTD Jun. 21, 2023.

Notice of Allowance on U.S. Appl. No. 17/743,073 DTD Oct. 20, 2023.

US Notice of Allowance on U.S. Appl. No. 17/002,473 DTD Jan. 25, 2022.

Taiwan Notice of Allowance on TW Appl. Ser. No. 110110381 dated Mar. 28, 2022 (4 pages).

* cited by examiner

MEMORY DEVICE WITH WORD LINE PULSE RECOVERY

REFERENCE TO RELATED APPLICATIONS

This application is a Continuation of U.S. patent application Ser. No. 17/743,073, filed May 12, 2022, which is a continuation of U.S. patent application Ser. No. 17/002,473, filed Aug. 25, 2020, both of which are incorporated herein by reference in their entireties.

BACKGROUND

Many modern electronic devices and systems include substantial computational capability for controlling and managing a wide range of functions and useful applications. The computational power of these modern devices and systems is typically provided by one or more processor "cores." These processor cores operate as a digital computer, in general retrieving executable instructions from memory, performing arithmetic and logical operations on digital data retrieved from memory, and storing the results of those operations in memory. Other input and output functions for acquiring and outputting the data processed by the processor cores are performed as appropriate. Considering the large amount of digital data often involved in performing the complex functions of these modern devices, significant solid-state memory capacity is generally implemented in the electronic circuitry for these systems.

Static random access memory (SRAM) has become the memory technology of choice for much of the solid-state data storage requirements in these modern power-conscious electronic systems. As is fundamental in the art, SRAM cells store contents "statically", in that the stored data state remains latched in each cell so long as power is applied to the memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
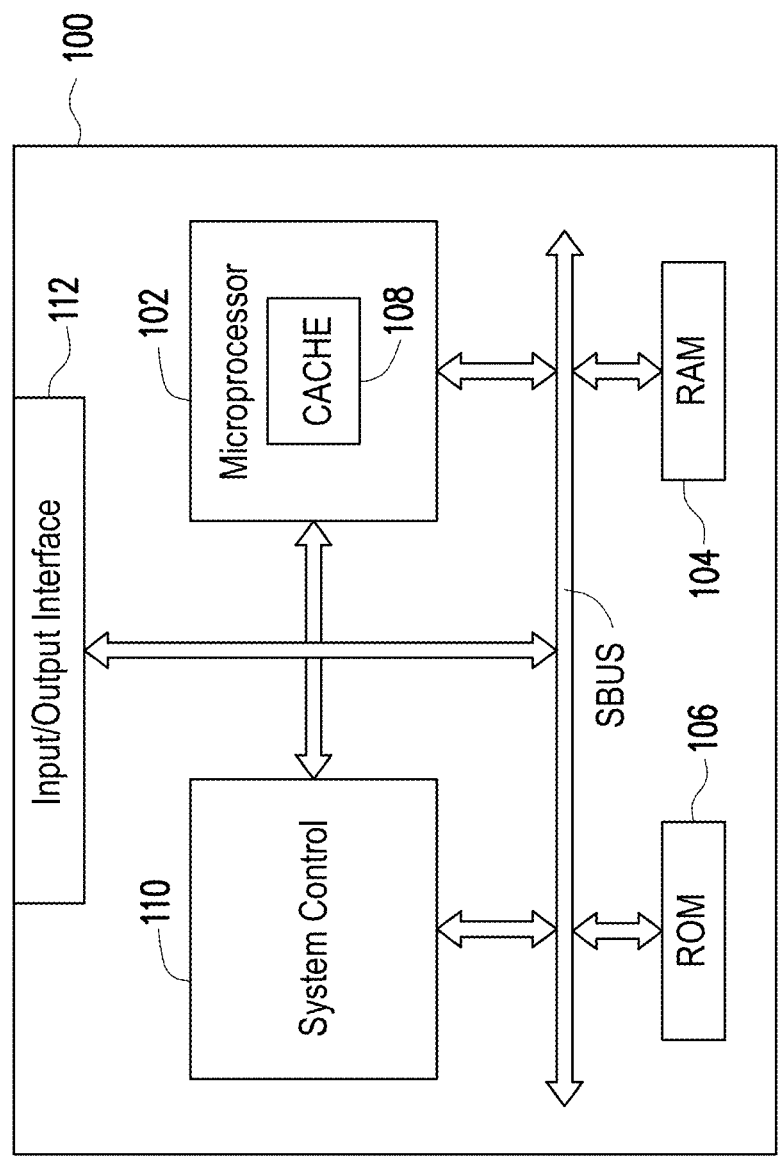
FIG. 1 illustrates a block diagram of an example of large-scale integrated circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Static random access memory (SRAM) is a type of volatile semiconductor memory that stores data bits using bi-stable circuitry that does not need refreshing. An SRAM device typically includes one or more memory arrays, wherein each array includes a plurality of SRAM cells. An SRAM cell is typically referred to as a memory cell (bit cell) because it stores one bit of information, represented by the logic state of two cross coupled inverters. Each memory array includes multiple bit cells arranged in rows and columns. Each bit cell in a memory array typically includes connections to a power supply voltage and to a reference voltage. Logic signals on bit lines control reading from and writing to a bit cell, with a word line controlling connections of the bit lines to the inverters, which otherwise float. A word line may be coupled to plural bit cells along a row of a memory array, with different word lines provided for different rows.

In general, when a bit cell is selected (e.g., to be read or written), a word line signal is provided to assert the bit cell's corresponding word line. For example, upon the corresponding word line being asserted, a write operation can be performed on the bit cell during a period when the word line signal remains at a high logic state (typically referred to as "word line pulse width"). Concurrently with writing the selected bit cell, the other bit cells coupled to the asserted word line may also be activated. Even though no write operations are performed on such unselected bit cells, a dummy read operation (e.g., reading the bit cells through respective bit line(s) but not coupling to sense amplifiers) may still be performed on each of the unselected bit cells. As such, the bit lines of the unselected bit cells can capacitively couple to the word line, which can deteriorate the word line signal. For example, such bit line-word line capacitive coupling can decrease the slope of a rising edge of the word line signal, which can shrink the word line pulse width. Such a shrunk word line pulse width can negatively impact the performance of the memory device (e.g., write yield).

To resolve this issue, the existing technologies have proposed using one or more tracking schemes to emulate the write time (and/or the read time) of the bit cells so as to recover (e.g., extend) the word line pulse width. However, it may be not entirely satisfactory using the existing tracking schemes to resolve the issue when the respective sizes of memory arrays of the memory device span over a relatively wide range. For example, in a memory device including multiple memory arrays, the issue of bit line-word line capacitive coupling may be exaggerated in the memory array with a relatively large size (e.g., having a relatively large number of rows and/or a relatively large number of columns) and the memory array with a relatively small size (e.g., having a relatively small number of rows). In this regard, two or more different tracking schemes are typically required to accommodate the different sizes of memory arrays, which can disadvantageously increase the design complexity and in turn the cost/power/area.

The present disclosure provides various embodiments of a memory device including a tracking word line (WL) circuit and a tracking bit line (BL) circuit that directly emulate respective BL-WL capacitive coupling of each of the one or more memory arrays of the memory device. As such, even though the respective sizes of the memory arrays may vary from one another significantly, the memory device can use one tracking scheme to recover the respective word line pulse widths of such different sized memory arrays. In some embodiments, the tracking WL circuit can intentionally (and directly) emulate the BL-WL capacitive coupling. For example, the tracking WL circuit may emulate the BL-WL capacitive coupling by coupling itself to the BLs of each of the memory arrays. In another example, the tracking WL circuit may emulate the BL-WL capacitive coupling by coupling itself to a replica BL that emulates the loading of BLs of each of the memory arrays. In this way, the size of each of the memory arrays can be accurately "tracked" by the tracking WL circuit. By coupling the tracking WL circuit to the tracking BL circuit to reflect the tracked BL-WL capacitive coupling, a discharging time of the tracking BL circuit can be advantageously extended, which can automatically recover (e.g., extend) the WL pulse width. As such, even though the issue of BL-WL capacitive coupling occurs, the WL pulse width of each of the different sized memory arrays can still be accurately recovered according to the respective size.

FIG. 1 illustrates a block diagram of an example of large-scale integrated circuit 100, in the form of a so-called "system-on-a-chip" ("SoC"), as used in various electronic systems. Integrated circuit 100 may be a single-chip integrated circuit into which an entire computer architecture is realized. As such, in this example, integrated circuit 100 includes a central processing unit of microprocessor 102, which is connected to system bus SBUS. Various memory resources, including random access memory (RAM) 104 and read-only memory (ROM) 106, reside on system bus SBUS and are thus accessible to microprocessor 102. ROM 106 may be realized as mask-programmed ROM, electrically erasable programmable read-only memory (EEPROM) such as "flash" EEPROM, or the like, and typically serves as program memory, storing the program instructions executable by microprocessor 102, while RAM 104 serves as data memory. In some cases, program instructions may reside in RAM 104 for recall and execution by microprocessor 102. Cache memory 108 (such as level 1, level 2, and level 3 caches, each typically implemented as SRAM) provides another memory resource, and resides within microprocessor 102 itself and therefore does not require bus access. Other system functions are shown, in a generic sense, in integrated circuit 100 by way of system control 110 and input/output interface 112.

It is appreciated that integrated circuit 100 may include additional or alternative functions to those shown in FIG. 1, or may have its functions arranged according to a different architecture from that shown in FIG. 1. The architecture and functionality of integrated circuit 100 is thus provided only by way of example, and is not intended to limit the scope of the present disclosure.

Figure 2:
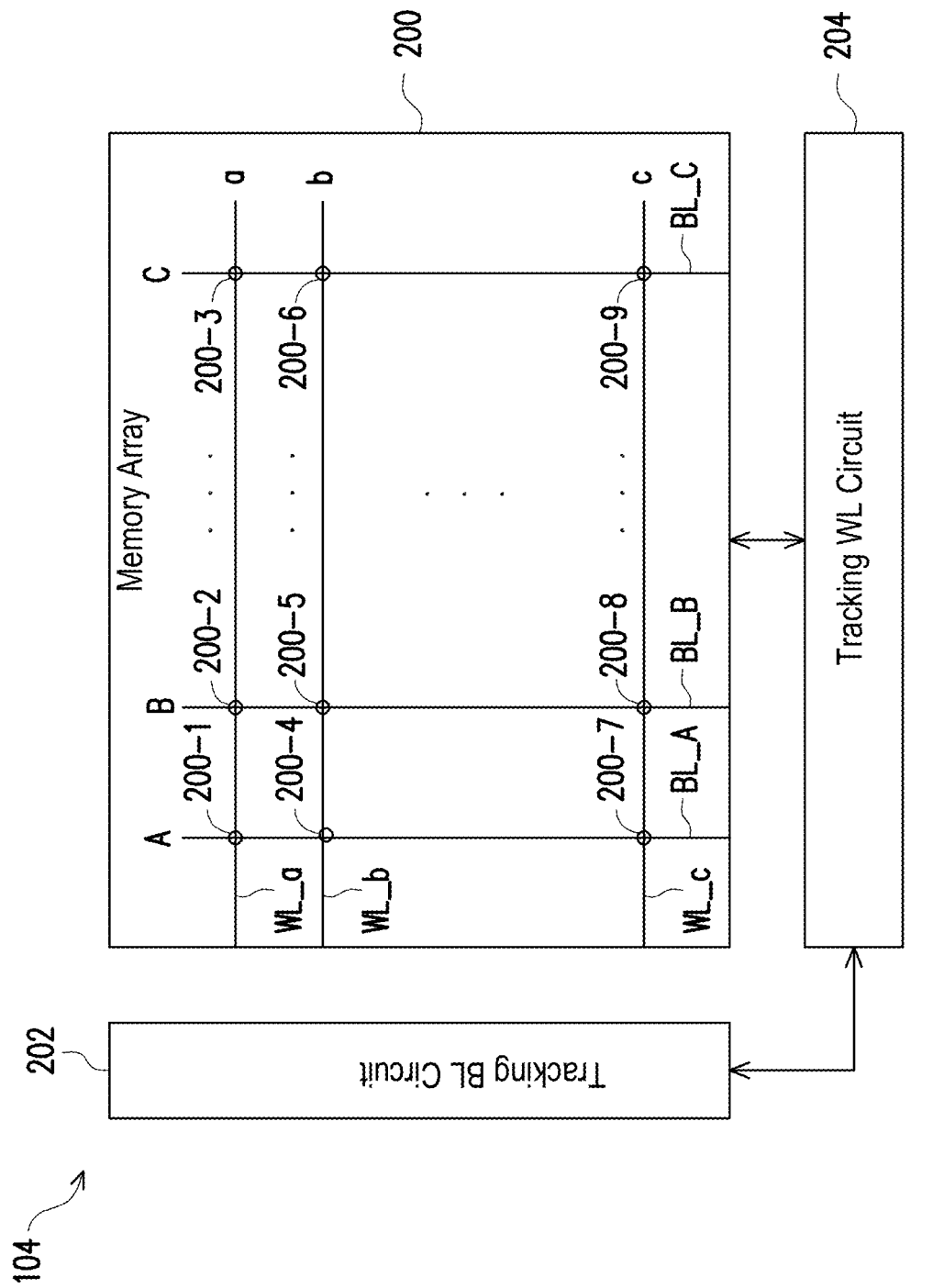
FIG. 2 illustrates a block diagram of a memory device of the integrated circuit of FIG. 1 that includes a tracking word line (WL) circuit and tracking bit line (BL) circuit, in accordance with some embodiments.

FIG. 2 illustrates a block diagram of a construction of RAM 104 of integrated circuit 100 (e.g., a memory device), that includes the tracking WL circuit and tracking BL circuit as disclosed herein. Of course, a similar construction may be used to realize other memory resources such as cache memory 108. In some other embodiments, RAM 104 may correspond to a stand-alone memory integrated circuit (i.e., rather than as an embedded memory as shown in FIG. 1).

As shown in FIG. 2, RAM 104 includes memory array 200, tracking BL circuit 202, and tracking WL circuit 204 that are operatively coupled to one another. Although memory array 200, tracking BL circuit 202, and tracking WL circuit 204 are illustrated as discrete components (blocks) in the illustrated embodiment of FIG. 1, at least two or more of memory array 200, tracking BL circuit 202, and tracking WL circuit 204 may be integrated as a single component while remaining within the scope of the present disclosure. It is understood that the illustrated embodiment of RAM 104 in FIG. 2 is simplified and thus, RAM 104 can include one or more other blocks (or circuits) while remaining within the scope of the present disclosure. For example, RAM 104 can include a row (WL) decoder, a row (WL) driver, a column (BL) driver, one or more input/output circuits (sense amplifiers), etc.

In some embodiments, memory array 200 may include a static random access memory (SRAM) array. However, any of a variety of memory array (e.g., a resistive random access memory (RRAM) array, a dynamic random access memory (DRAM) array, a magnetoresistive random access memory (MRAM) array, etc.) may be implemented as memory array 200 while remaining within the scope of the present disclosure.

Memory array 200 includes a plurality of memory cells arranged in a column-row configuration. For example, memory array 200 includes a plurality of memory cells (e.g., 200-1, 200-2, 200-3, 200-4, 200-5, 200-6, 200-7, 200-8, 200-9, etc.) in which each column has a bit line (BL) and a bit bar line (BBL) and each row has a word line (WL). The BL and BBL of each column are respectively coupled to a plurality of memory cells that are disposed in that column, and each memory cell in that column is arranged on a different row and coupled to a respective (different) WL. That is, each memory cell of memory array 200 is coupled to a BL of a column of memory array 200, a BBL of the column of the memory array 200, and a WL of a row of memory array 200. In some embodiments, the BLs and BBLs are arranged in parallel vertically and the WLs are arranged in parallel horizontally (i.e., perpendicular to the BLs and BBLs).

Referring still to FIG. 2, and in greater detail, nine memory cells (e.g., 200-1, 200-2, 200-3, 200-4, 200-5, 200-6, 200-7, 200-8, 200-9) are shown in memory array 200 for illustration purposes. Based on the above description, columns "A," "B," and "C," and rows "a," "b," and "c" are accordingly shown in memory array 200. Memory cells 200-1, 200-4, and 200-7 are arranged along column A; memory cells 200-2, 200-5, and 200-8 are arranged along column B; memory cells 200-3, 200-6, and 200-9 are arranged along column C; memory cells 200-1, 200-2, and 200-3 are arranged along row a; memory cells 200-4, 200-5, and 200-6 are arranged along row b; and memory cells 200-7, 200-8, and 200-9 are arranged along row c. Moreover, memory cells 200-1, 200-4, and 200-7 arranged along column A are all coupled to a respective BL of column A, "BL_A," and are each coupled to a WL of the respective row: WL_a, WL_b, and WL_c; memory cells 200-2, 200-5, and 200-8 arranged along column B are all coupled to a respective BL of column B, "BL_B," and are each coupled to a WL of the respective row: WL_a, WL_b, and WL_c; memory cells 200-3, 200-6, and 200-9 arranged along column C are all coupled to a respective BL of column C, "BL_C," and are each coupled to a WL of the respective row: WL_a, WL_b, and WL_c.

Each memory cell of memory array 200 is configured to store/present a data bit, or a datum. Such a data bit may be repeatedly read out from (i.e., a read operation) or written to (i.e., a write operation) each bit cell with a respective logic state (i.e., either a logical 1 or a logical 0). Although the illustrated embodiment of FIG. 2 shows nine memory cells in memory array 200, any desired number of memory cells may be included in memory array 200 while remaining within the scope of the present disclosure. As such, the number of columns and rows (and corresponding BLs/BBLs and WLs) can be adjusted in accordance with the number of memory cells in memory array 200. Also, for purposes of brevity, only BLs, instead of both the BLs and BBLs, are shown along respective columns of memory array 200 in FIG. 2.

According to various embodiments of the present disclosure, tracking WL circuit 204 can be either directly coupled (e.g., physically connected) or operatively coupled (e.g., not physically connected but communicatively coupled) to memory array 200 (e.g., one or more of the BLs/BBLs of memory array 200) so as to emulate the effect of capacitive coupling between the WLs and BLs within memory array 200. By emulating the effect, tracking WL circuit 204 can generate a tracking WL signal that emulates a WL signal actually present on one or more of the WLs of memory array 200. In response, tracking BL circuit 202, which includes a number of tracking BL cells configured to emulate an electrical signal path propagating across memory array 200, can use such a tracking WL signal to recover (e.g., extend) a pulse width of the actual WL signal.

Various embodiments of tracking WL circuit 204 and tracking BL circuit 202 shall be discussed below with respect to FIGS. 3, 4, 5, 6, 7A, 7B, and 7C, respectively. It is understood that RAM 104 can include multiple memory arrays, each of which is characterized with a respective size (e.g., a respective number of rows and/or a respective number of columns). In some embodiments, each of the memory arrays may correspond to a respective tracking WL circuit and a respective tracking BL circuit to accurately recover the respective WL signal. In some other embodiments, at least some of the memory arrays may correspond to a common tracking WL circuit and/or a common tracking BL circuit.

Figure 3:
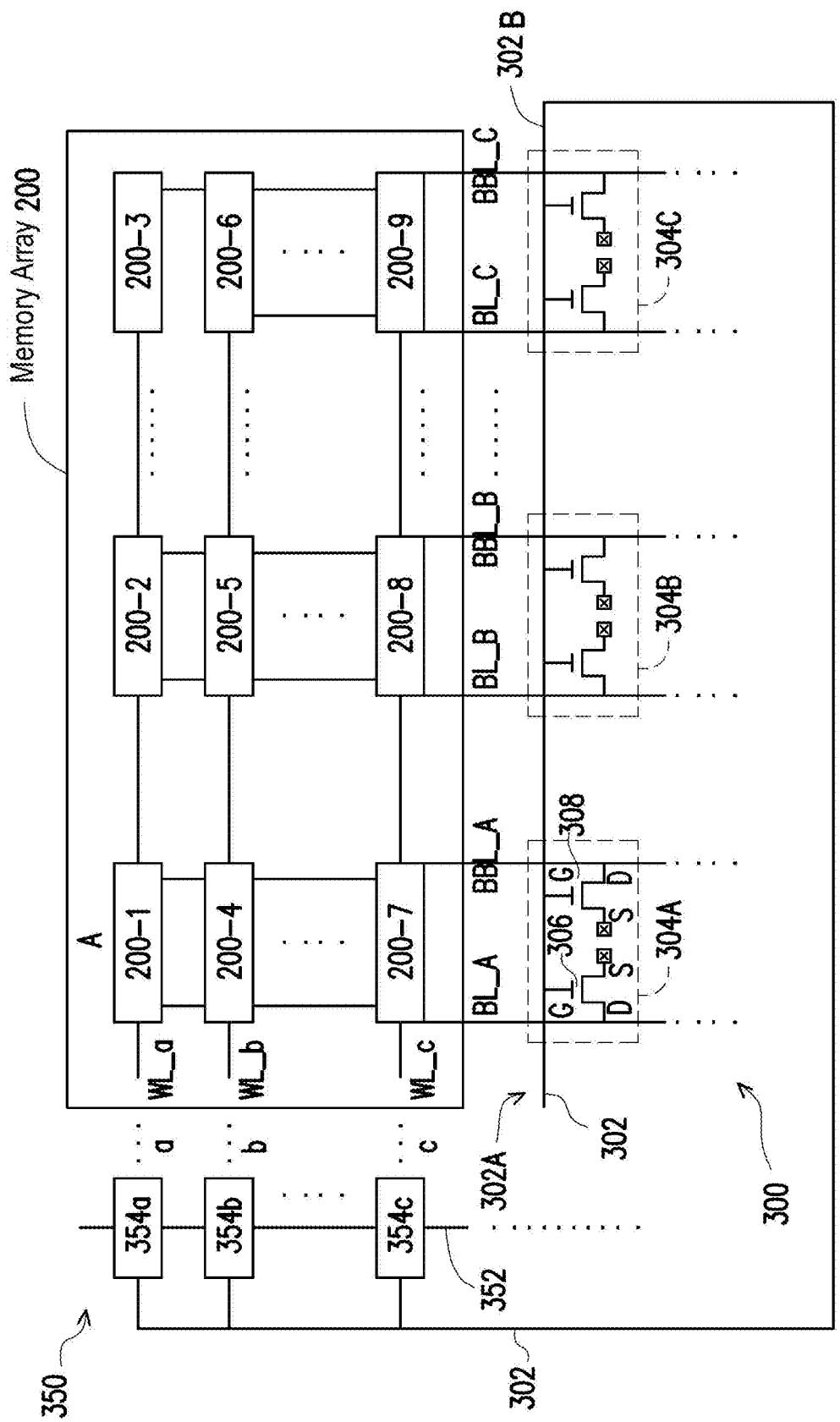
FIG. 3 illustrates an example circuit diagram of the tracking WL circuit and an example schematic diagram of the tracking BL circuit of FIG. 2, in accordance with some embodiments.

Referring to FIG. 3, a circuit diagram of an example tracking WL circuit 300 and a circuit diagram of an example tracking BL circuit 350 are illustrated, respectively, in accordance with various embodiments. Tracking WL circuit 300 and tracking BL circuit 350 can be respective examples of tracking WL circuit 204 and tracking BL circuit 202 of FIG. 2.

As shown in FIG. 3, tracking WL circuit 300 includes tracking WL 302 and a number of tracking WL cells (e.g., 304A, 304B, 304C, etc.). At least a portion of tracking WL 302 may be extended from one end of memory array 200 to the other end of memory array to emulate the WLs (e.g., WL_a, WL_b, WL_c, etc.) of memory array 200. Tracking WL cells 304A-C are commonly coupled to tracking WL 302. Further, one or more delay elements (e.g., delay lines, inverters, etc.) can be coupled to tracking WL 302 to produce RC delay on tracking WL 302, if desired. For example, one or more delay elements can be inserted to portion 302A of tracking WL 302 and/or portion 302B of tracking WL 302.

Tracking WL cells 304A-C can correspond to columns of memory array 200, respectively. For example, tracking WL cell 304A corresponds to column A of memory array 200; tracking WL cell 304B corresponds to column B of memory array 200; and tracking WL cell 304C corresponds to column C of memory array 200. Specifically, each of the tracking WL cells 304A-C can be directly coupled to the BL (and BBL) of the corresponding column. For example, tracking WL cell 304A is directly coupled to BL_A (and BBL_A) of column A of memory array 200; tracking WL cell 304B is directly coupled to BL_B (and BBL_B) of column B of memory array 200; and tracking WL cell 304C is directly coupled to BL_C (and BBL_C) of column C of memory array 200. As such, tracking WL circuit 300 can emulate the effect of BL-WL coupling that may occur in memory array 200, which shall be discussed in further detail below with respect to FIG. 9.

Each of the tracking WL cells 304A-C can include one or more transistors, with respective source floated. Using tracking WL cell 304A as a representative example, tracking WL cell 304A includes two transistors 306 and 308. In some embodiments, transistors 306 and 308 each includes, but not limited to, an n-type metal-oxide-semiconductor field-effect-transistor (nMOSFET). However, each of the transistors 306 and 308 can include any of various other types of transistors (e.g., a p-type metal-oxide-semiconductor field-effect-transistor (pMOSFET), a bipolar junction transistor (BJT), a high-electron mobility field-effect-transistor (HEMFET), etc.) while remaining within the scope of the present disclosure. Specifically in FIG. 3, respective gates of transistors 306 and 308 are connected to tracking WL 302; a drain of transistor 306 is connected to BL_A; a drain of transistor 308 is connected to BBL_A; and respective sources of transistors 306 and 308 are floated. In this way, transistors 306 and 308 can emulate the capacitive coupling between the BLs (e.g., BL_A, BBL_A) and the WLs (e.g., WL_a, WL_b, WL_c) to tracking WL 302 by coupling their drains, which are respectively coupled to the BL_A and BBL_A, to their gates, which are commonly coupled to tracking WL 302, while not affecting the normal write operation performed in memory array 200 (as their sources are floated).

Tracking BL circuit 350 includes tracking BL 352 and a number of tracking BL cells (e.g., 354a, 354b, 354c, etc.). At least a portion of tracking BL 352 may be extended from one end of memory array 200 to the other end of memory array to emulate the BLs/BBLs (e.g., BL_A, BL_B, BL_C, etc.) of memory array 200. Each of the tracking BL cells 354a-c is respectively coupled to tracking WL 302. Tracking BL cells 354a-c are commonly coupled to tracking BL 352. Tracking BL cells 354a-c can correspond to (e.g., be aligned or coupled to) rows of memory array 200, respectively. For example, tracking BL cell 354a corresponds to row a of memory array 200; tracking BL cell 354b corresponds to row b of memory array 200; and tracking BL cell 354c corresponds to row c of memory array 200. Each of the tracking BL cells 354a-c is substantially similar to the memory cell (e.g., 200-1, 200-2, etc.) of memory array 200 and configured to store a logic 0 to emulate the BLs/BBLs of memory array 200. For example, when the memory cell of memory array 200 is implemented as a 6-transistor SRAM memory cell, tracking BL cells 354a-c can each be a 6-transistor SRMA memory cell but is configured to permanently store a logic 0. However, it is understood that each of the tracking BL cells 354a-c can be implemented differently from the memory cell of memory array 200 while remaining within the scope of the present disclosure. Examples of tracking BL cells 354a-c shall be discussed in further detail below with respect to FIG. 8.

Figure 4:
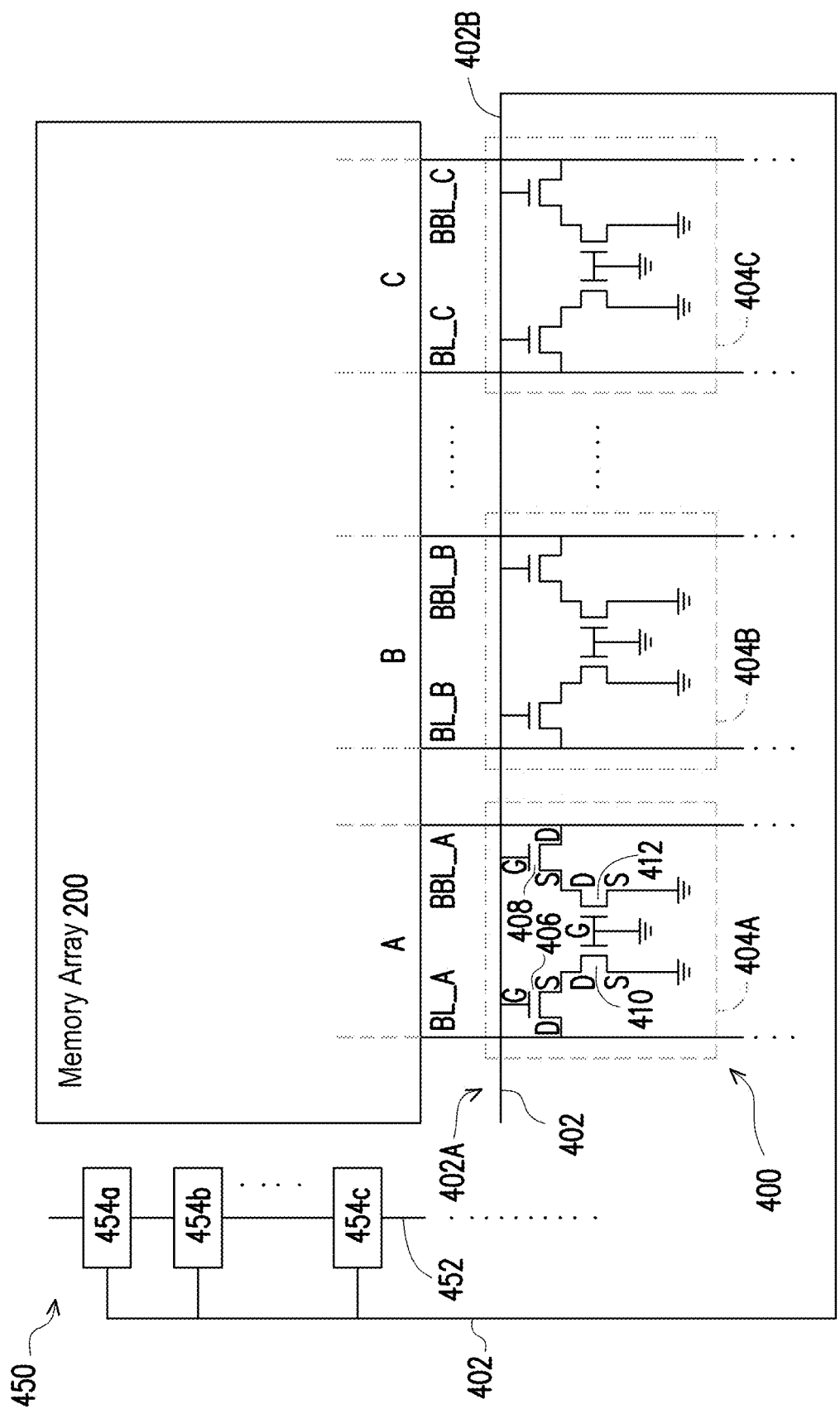
FIG. 4 illustrates another example circuit diagram of the tracking WL circuit and another example schematic diagram of the tracking BL circuit of FIG. 2, in accordance with some embodiments.

Referring to FIG. 4, a circuit diagram of an example tracking WL circuit 400 and a circuit diagram of an example tracking BL circuit 450 are illustrated, respectively, in accordance with various embodiments. Tracking WL circuit 400 and tracking BL circuit 450 can be respective examples of tracking WL circuit 204 and tracking BL circuit 202 of FIG. 2.

As shown in FIG. 4, tracking WL circuit 400 includes tracking WL 402 and a number of tracking WL cells (e.g., 404A, 404B, 404C, etc.). At least a portion of tracking WL 402 may be extended from one end of memory array 200 to the other end of memory array to emulate the WLs (e.g., WL_a, WL_b, WL_c, etc.) of memory array 200. Tracking WL cells 404A-C are commonly coupled to tracking WL 402. Further, one or more delay elements (e.g., delay lines, inverters, etc.) can be coupled to tracking WL 402 to produce RC delay on tracking WL 402, if desired. For example, one or more delay elements can be inserted to portion 402A of tracking WL 402 and/or portion 402B of tracking WL 402.

Tracking WL cells 404A-C can correspond to columns of memory array 200, respectively. For example, tracking WL cell 404A corresponds to column A of memory array 200; tracking WL cell 404B corresponds to column B of memory array 200; and tracking WL cell 404C corresponds to column C of memory array 200. Specifically, each of the tracking WL cells 404A-C can be directly coupled to the BL (and BBL) of the corresponding column. For example, tracking WL cell 404A is directly coupled to BL_A (and BBL_A) of column A of memory array 200; tracking WL cell 404B is directly coupled to BL_B (and BBL_B) of column B of memory array 200; and tracking WL cell 404C is directly coupled to BL_C (and BBL_C) of column C of memory array 200. As such, tracking WL circuit 400 can emulate the effect of BL-WL coupling that may occur in memory array 200, which shall be discussed in further detail below with respect to FIG. 9.

Each of the tracking WL cells 404A-C can include one or more transistors, with respective source floated. Using tracking WL cell 404A as a representative example, tracking WL cell 404A includes four transistors 406, 408, 410, and 412. In some embodiments, transistors 406-412 each includes, but not limited to, an n-type metal-oxide-semiconductor field-effect-transistor (nMOSFET). However, each of the transistors 406-412 can include any of various other types of transistors (e.g., a p-type metal-oxide-semiconductor field-effect-transistor (pMOSFET), a bipolar junction transistor (BJT), a high-electron mobility field-effect-transistor (HEMFET), etc.) while remaining within the scope of the present disclosure. Specifically in FIG. 4, respective gates of transistors 406 and 408 are connected to tracking WL 402; a drain of transistor 406 is connected to BL_A; a drain of transistor 408 is connected to BBL_A; a source of transistor 406 is connected to a drain of transistor 410; a source of transistor 408 is connected to a drain of transistor 412; respective gates of transistors 410 and 412 are connected to ground; and respective sources of transistors 410 and 412 are also connected to ground. Effectively, transistors 406 and 408 may be floated at their respective sources. In this way, transistors 406 and 408 can emulate the capacitive coupling between the BLs (e.g., BL_A, BBL_A) and the WLs (e.g., WL_a, WL_b, WL_c) to tracking WL 402 by coupling their drains, which are respectively coupled to the BL_A and BBL_A, to their gates, which are commonly coupled to tracking WL 402, while not affecting the normal write operation performed in memory array 200 (as their sources are floated).

Tracking BL circuit 450 includes tracking BL 452 and a number of tracking BL cells (e.g., 454a, 454b, 454c, etc.). Tracking BL 452 is substantially similar to tracking BL 352 as shown in FIG. 2; and each of the tracking BL cells 454a-c is substantially similar to tracking BL cells 354a-c. Thus, the details of tracking BL 452 and tracking BL cells 454a-c shall be discussed in further detail below with respect to FIG. 8.

Although tracking WL circuits 300 and 400 are illustrated as discrete components from memory array 200 in FIGS. 3 and 4, in some other embodiments, tracking WL circuits 300 and 400 can be respectively integrated into memory array 200. For example, each of the tracking WL circuits 300 and 400 may be formed on the same substrate (e.g., die) as memory array 200, which may advantageously reduce an overall area occupied by ROM 104, and a length of BLs/BBLs of memory array 200.

Figure 5:
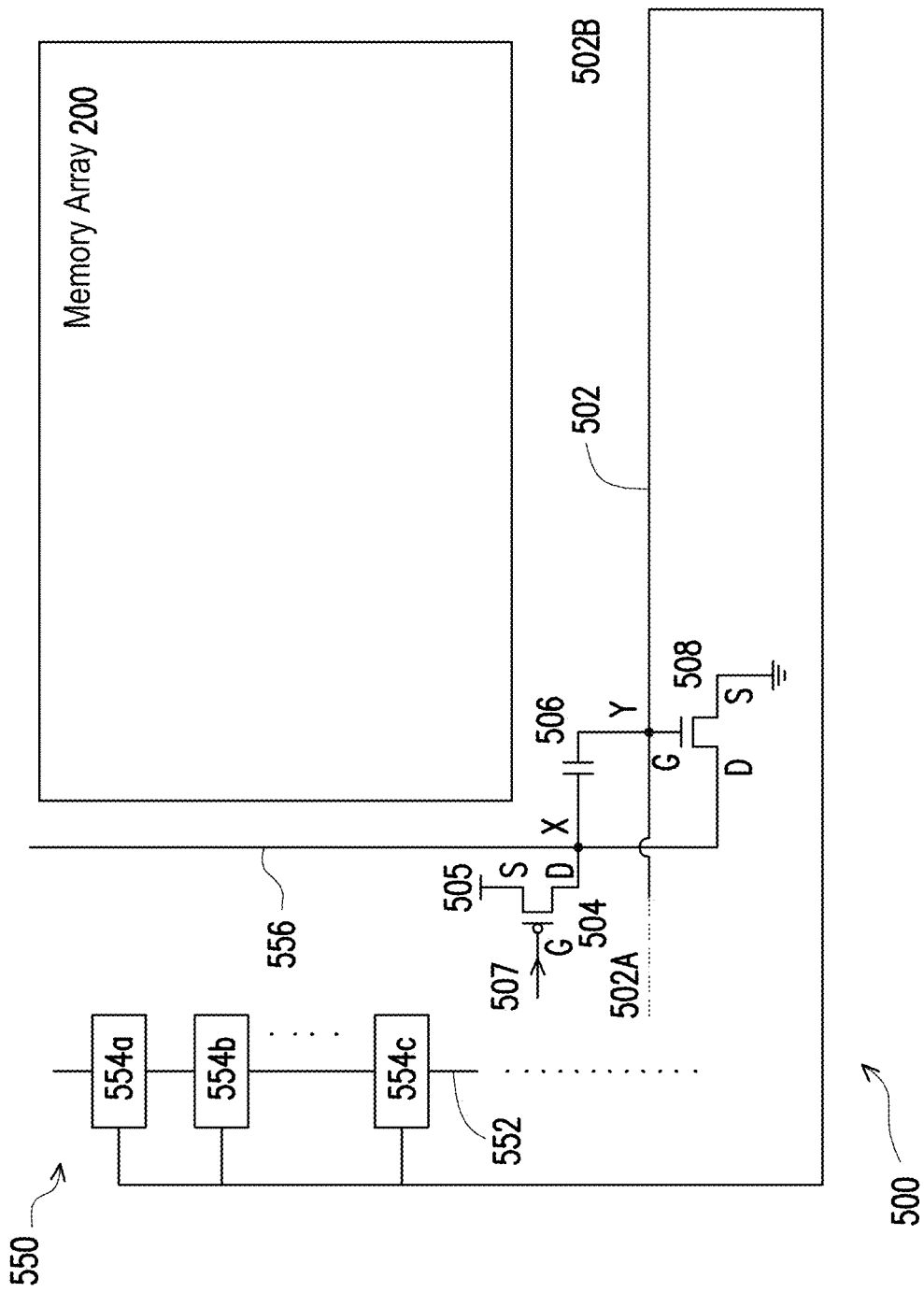
FIG. 5 illustrates yet another example circuit diagram of the tracking WL circuit and yet another schematic circuit diagram of the tracking BL circuit of FIG. 2, in accordance with some embodiments.

Referring to FIG. 5, a circuit diagram of an example tracking WL circuit 500 and a circuit diagram of an example tracking BL circuit 550 are illustrated, respectively, in accordance with various embodiments. Tracking WL circuit 500 and tracking BL circuit 550 can be respective examples of tracking WL circuit 204 and tracking BL circuit 202 of FIG. 2.

As shown in FIG. 5, tracking WL circuit 500 includes tracking WL 502, transistor 504, capacitor 506, and transistor 508. Transistors 504 and 508 respectively include, but not limited to, a pMOSFET and an nMOSFET. However, transistors 504 and 508 can each include any of various other types of transistors (e.g., a pMOSFET, an nMOSFET, a bipolar junction transistor (BJT), a high-electron mobility field-effect-transistor (HEMFET), etc.) while remaining within the scope of the present disclosure. Capacitor 506 can include a metal-oxide-semiconductor (MOS) capacitor, a metal-insulator-metal (MIM) capacitor, or the like. Optionally, tracking WL circuit 500 can include a number of tracking WL cells (which can be substantially similar to tracking WL cells 304A-C and 404A-C shown in FIGS. 3 and 4, respectively) coupled to tracking WL 502. At least a portion of tracking WL 502 may be extended from one end of memory array 200 to the other end of memory array to emulate the WLs (e.g., WL_a, WL_b, WL_c, etc.) of memory array 200. Further, one or more delay elements (e.g., delay lines, inverters, etc.) can be coupled to tracking WL 502 to produce RC delay on tracking WL 502, if desired. For example, one or more delay elements can be inserted to portion 502A of tracking WL 502 and/or portion 502B of tracking WL 502.

Tracking BL circuit 550 includes tracking BL 552, a number of tracking BL cells (e.g., 554a, 554b, 554c, etc.), and replica tracking BL 556. Tracking BL 552 is substantially similar to tracking BL 352 as shown in FIG. 2; and each of the tracking BL cells 554a-c is substantially similar to tracking BL cells 354a-c. Thus, the details of tracking BL 552 and tracking BL cells 554a-c shall be discussed in further detail below with respect to FIG. 8. Different from the examples of FIGS. 3 and 4, tracking BL circuit 550, as shown in FIG. 5, additionally includes replica tracking BL 556. In accordance with some embodiments, replica tracking BL 556, with no tracking BL cells coupled thereto, is configured to emulate one or more of the BLs/BBLs of memory array 200, so as to allow tracking WL circuit 500 to emulate the effect of BL-WL coupling that may occur in memory array 200, which shall be discussed in further detail below with respect to FIG. 9.

Referring still to FIG. 5, and in greater detail, one end (e.g., plate, or terminal) of capacitor 506 is connected to replica tracking BL 556 at a node, X, to which transistor 504 is connected, and the other end of capacitor 506 is connected to tracking WL 502 at a node, Y, to which transistor 508 is connected. Specifically, a source of transistor 504 is connected to power supply 505 (e.g., VDD), a gate of transistor 504 is controlled by control signal 507, and a drain of transistor 504 is connected to capacitor 506 at node X; and a drain of transistor 508 is connected to replica tracking BL 556, a gate of transistor 508 is connected to capacitor 506 at node Y, and a source of transistor 508 is connected to ground.

Figure 6:
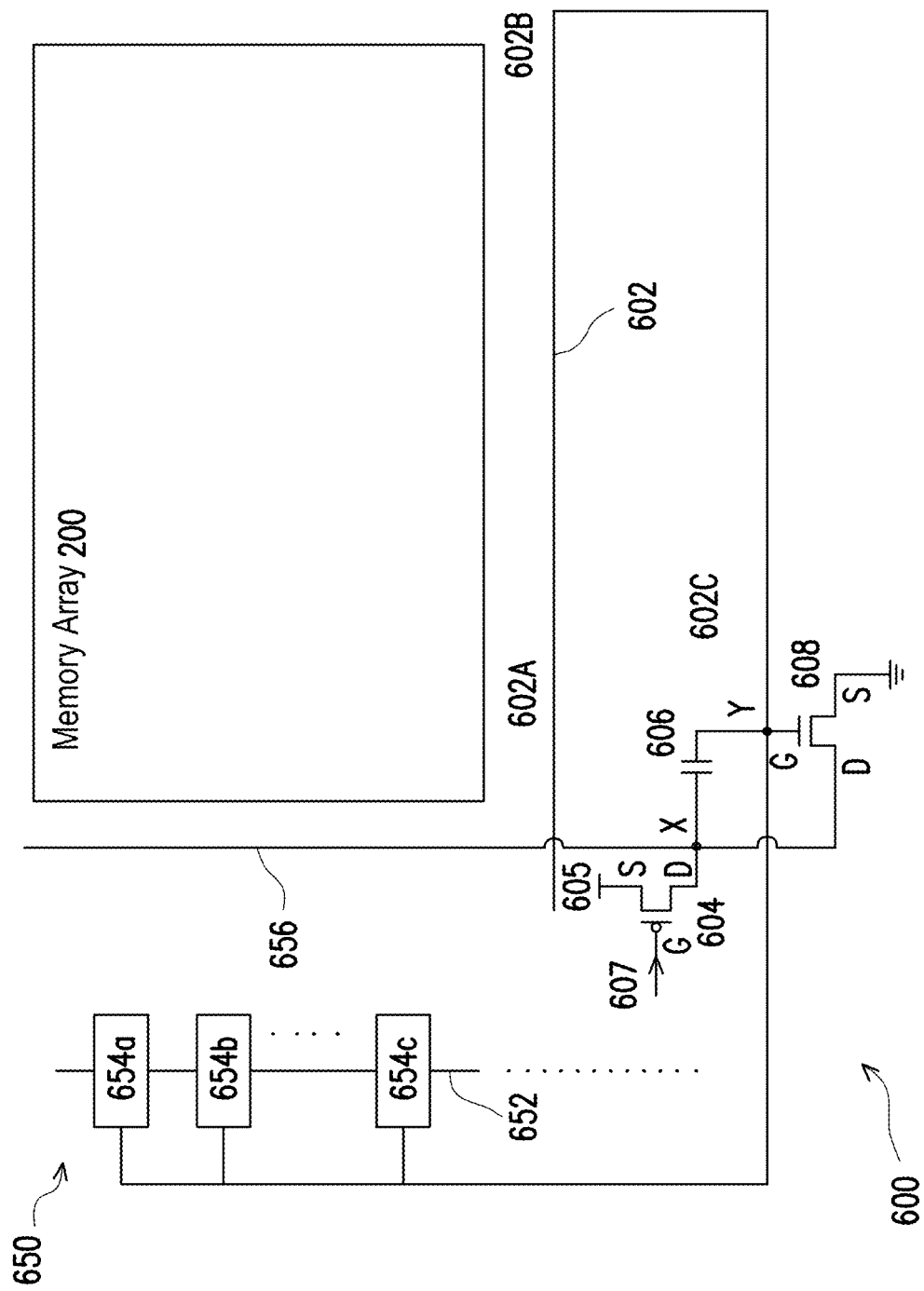
FIG. 6 illustrates yet another example circuit diagram of the tracking WL circuit and yet another example schematic diagram of the tracking BL circuit of FIG. 2, in accordance with some embodiments.

Referring to FIG. 6, a circuit diagram of an example tracking WL circuit 600 and a circuit diagram of an example tracking BL circuit 650 are illustrated, respectively, in accordance with various embodiments. Tracking WL circuit 600 and tracking BL circuit 650 can be respective examples of tracking WL circuit 204 and tracking BL circuit 202 of FIG. 2.

As shown in FIG. 6, tracking WL circuit 600 and tracking BL circuit 650 are substantially similar to tracking WL circuit 500 and tracking BL circuit 550, respectively, except that transistor 604, capacitor 606, and transistor 608 are coupled to tracking WL 602 at a farther portion, e.g., 602C. Thus, tracking WL circuit 600 and tracking BL circuit 650 are briefly described as follows. In tracking WL circuit 600, one end (e.g., plate, or terminal) of capacitor 606 is connected to replica tracking BL 656 at a node, X, to which transistor 604 is connected, and the other end of capacitor 606 is connected to tracking WL 602 at a node, Y, to which transistor 608 is connected. Specifically, a source of transistor 604 is connected to power supply 605 (e.g., VDD), a gate of transistor 604 is controlled by control signal 607, and a drain of transistor 604 is connected to capacitor 606 at node X; and a drain of transistor 608 is connected to replica tracking BL 656, a gate of transistor 608 is connected to capacitor 606 at node Y, and a source of transistor 608 is connected to ground. In tracking BL circuit 650, tracking BL circuit 650 includes tracking BL 652, a number of tracking BL cells (e.g., 654a, 654b, 654c, etc.), and replica tracking BL 656. As shall be discussed below, replica tracking BL 656 is configured to emulate the BLs/BBLs of memory array 200.

Figure 7A:
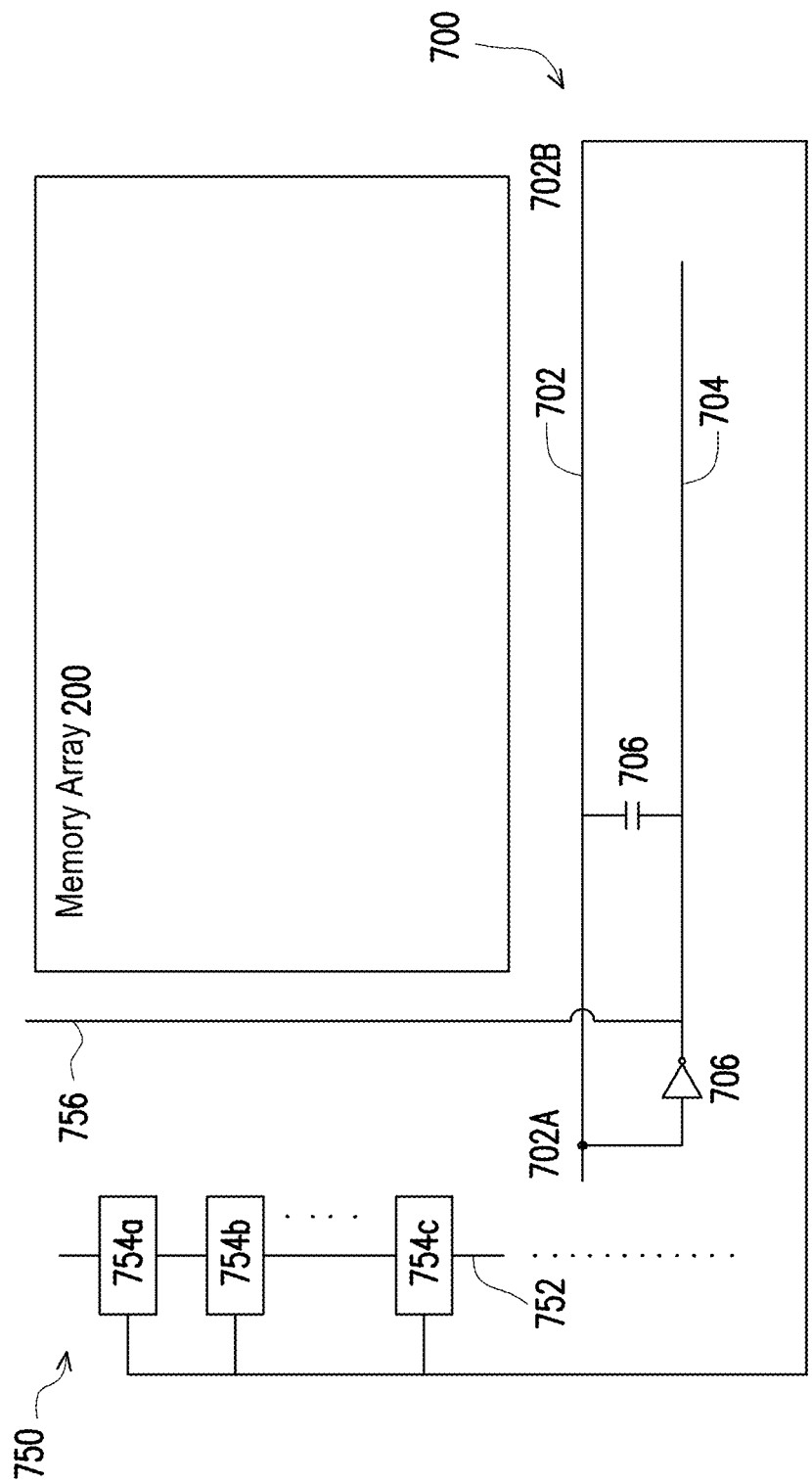
FIG. 7A illustrates yet another example circuit diagram of the tracking WL circuit and yet another example schematic diagram of the tracking BL circuit of FIG. 2, in accordance with some embodiments.

Referring to FIG. 7A, a circuit diagram of an example tracking WL circuit 700 and a circuit diagram of an example tracking BL circuit 750 are illustrated, respectively, in accordance with various embodiments. Tracking WL circuit 700 and tracking BL circuit 750 can be respective examples of tracking WL circuit 204 and tracking BL circuit 202 of FIG. 2.

As shown in FIG. 7A, tracking WL circuit 700 includes tracking WL 702, tracking WL 704, and an inverter 706. In accordance with various embodiments, tracking WL 702 and tracking WL 704 are configured to present signals that are logically inverted to each other by inverter 706. When fabricating tracking WL 702 and tracking WL 704, tracking WL 702 and tracking WL 704 are substantially adjacent to each other to intentionally induce capacitive coupling between these two tracking WLs. For example, at least a portion of tracking WL 702 is laterally close to at least a portion of tracking WL 704 by a certain distance. Various example implementations of tracking WLs 702 and 704 shall be discussed in further detail with respect to FIGS. 11-16C. By placing tracking WLs 702 and 704, which presents respective different logic states, close to each other, tracking WL 702 that is coupled to replica tracking BL 756 can disturb tracking WL 704. As such, a deteriorated WL signal can be emulated on tracking WL 702, which shall be discussed in further detail below.

Alternatively or additionally, tracking WL circuit 700 can include one or more capacitors 706 coupled between tracking WL 702 and tracking WL 704 to boost the capacitive coupling induced therebetween. Such a capacitor 706 can each include a metal-oxide-semiconductor (MOS) capacitor, a metal-insulator-metal (MIM) capacitor, or the like. At least a portion of each of the tracking WLs, 702 and 704, may be extended from one end of memory array 200 to the other end of memory array to emulate the WLs (e.g., WL_a, WL_b, WL_c, etc.) of memory array 200. Further, one or more delay elements (e.g., delay lines, inverters, etc.) can be coupled to tracking WL 702 to produce RC delay on tracking WL 702, if desired. For example, one or more delay elements can be inserted to portion 702A of tracking WL 702 and/or portion 702B of tracking WL 702.

Figure 7B:
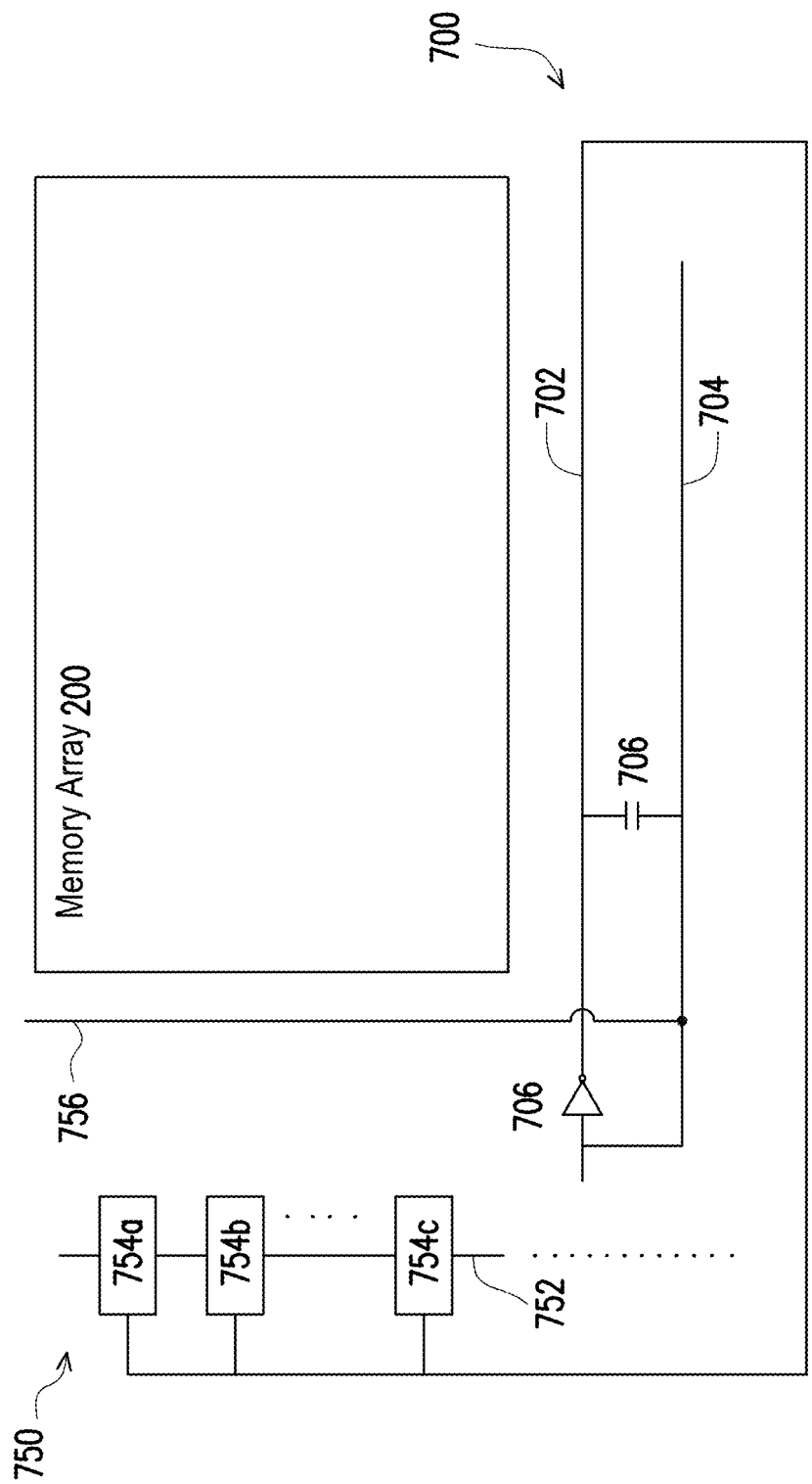
FIG. 7B illustrates yet another example circuit diagram of the tracking WL circuit and yet another example schematic diagram of the tracking BL circuit of FIG. 2, in accordance with some embodiments.
Figure 7C:
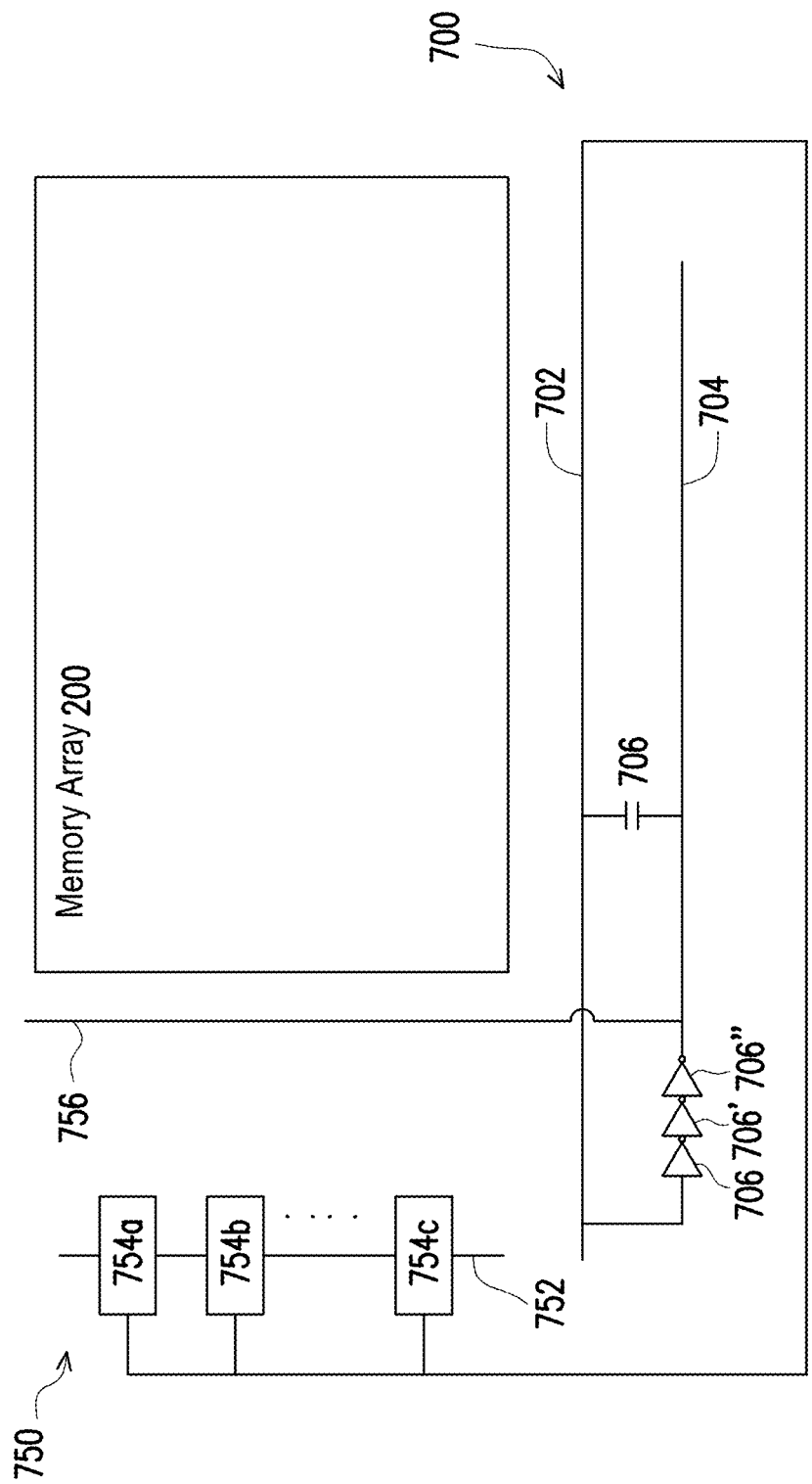
FIG. 7C illustrates yet another example circuit diagram of the tracking WL circuit and yet another example schematic diagram of the tracking BL circuit of FIG. 2, in accordance with some embodiments.

FIGS. 7B and 7C illustrate alternative configurations of tracking WL circuit 700, respectively, in accordance with various embodiments. For example in FIG. 7B, tracking WLs 702 and 704 are still configured to present logically inverted signals by inverter 706 as shown in FIG. 7A except that inverter 706 is connected to tracking WL 702. In some embodiments, tracking WL circuit 700 can include any desired odd number of inverters connected to one of tracking WLs 702 and 704 to cause tracking WLs 702 and 704 to present logically inverted signals. For example in FIG. 7C, tracking WL circuit 700 includes three inverters, 706, 706', and 706", connected to tracking WL 704.

Figure 8:
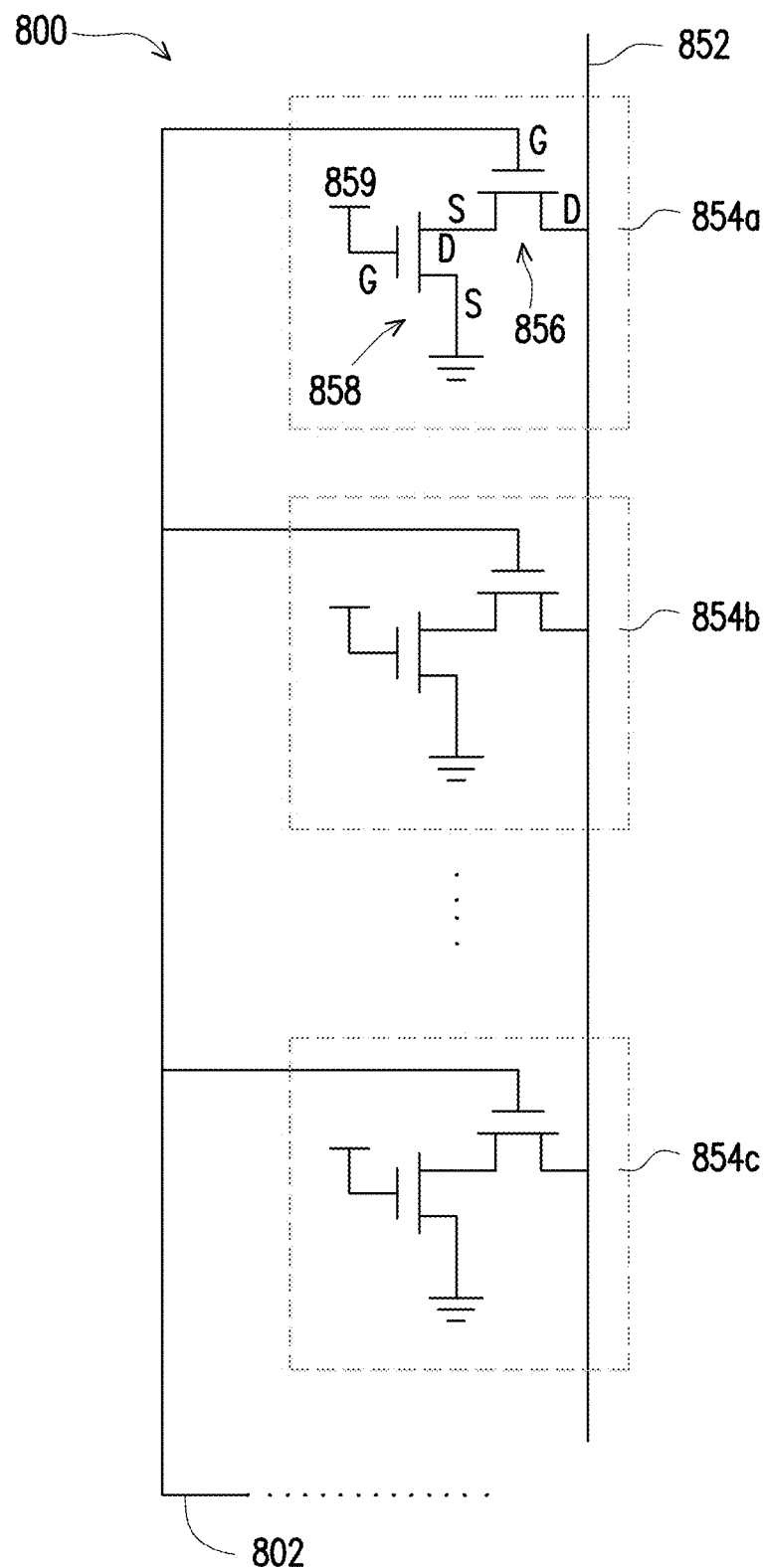
FIG. 8 illustrates an example circuit diagram of the tracking BL circuit of FIG. 2, in accordance with some embodiments.

Referring to FIG. 8, depicted is an example circuit diagram of a portion of a tracking BL circuit 850 coupled to tracking WL 802, in accordance with various embodiments. As shown, tracking BL circuit 800 includes tracking BL 852 and number of tracking BL cells (e.g., 854a, 854b, 854c, etc.). Tracking WL 802 can be an example of tracking WL, 302, 402, 502, 602, and 702, and 704, as respectively shown in FIGS. 3, 4, 5, 6 and 7A-C; and tracking BL 852 and tracking BL cells 854a-c can be respective examples of tracking BL, 352, 452, 552, 652, and 752, and tracking BL cells, 354a-c, 454a-c, 654a-c, 754a-c, as shown in FIGS. 3, 4, 5, 6, and 7A-C.

In some embodiments, each of the tracking BL cells 854a-c is substantially similar as the memory cells of memory array 200. In an example where the memory cell of memory array 200 includes a 6-transistor (6T) SRAM memory cell, each of the tracking BL cells 854a-c can include a 6T SRAM memory cell accordingly. It is understood that the memory cells of memory array 200 can include any of a variety of other SRAM memory cell configurations or other memory cells such as, for example, 2T-2R SRAM memory cell, 4T-SRAM memory cell, 8T-SRAM memory cell, 10T-SRAM memory cell, RRAM memory cell, MRAM memory cell, etc. As such, each of the tracking BL cells 854a-c can include an according memory cell substantial similar to the memory cells of memory array 200.

To cause tracking BL circuit 850 to emulate the BLs/BBLs of memory array 200, the tracking BL cells 854a-c can all be written to a same logic state, e.g., a logic 0. As such, each of the tracking BL cells 854a-c configured as a 6T SRAM memory cell, for example, may be effectively represented by two transistors (e.g., 856 and 858), as shown in FIG. 8. Transistor 856 may represent one of the access transistors of a 6T SRAM memory cell and transistor 858 may represent one of the pull-down transistors of the 6T SRAM memory cell, as known by persons of ordinary skill in the art. Specifically, a gate and a drain of transistor 856 are connected to tracking WL 802 and tracking BL 852, respectively. As such a memory cell that stores a logic 0, a gate of transistor 858 is connected to a logic 1 (logically inverted to that logic 0) with its drain and source of transistor 858 respectively connected to a source of transistor 856 and ground. Thus, a logic high state present on tracking BL 852 can be pulled down to ground through transistors 856 and 858.

Figure 9:
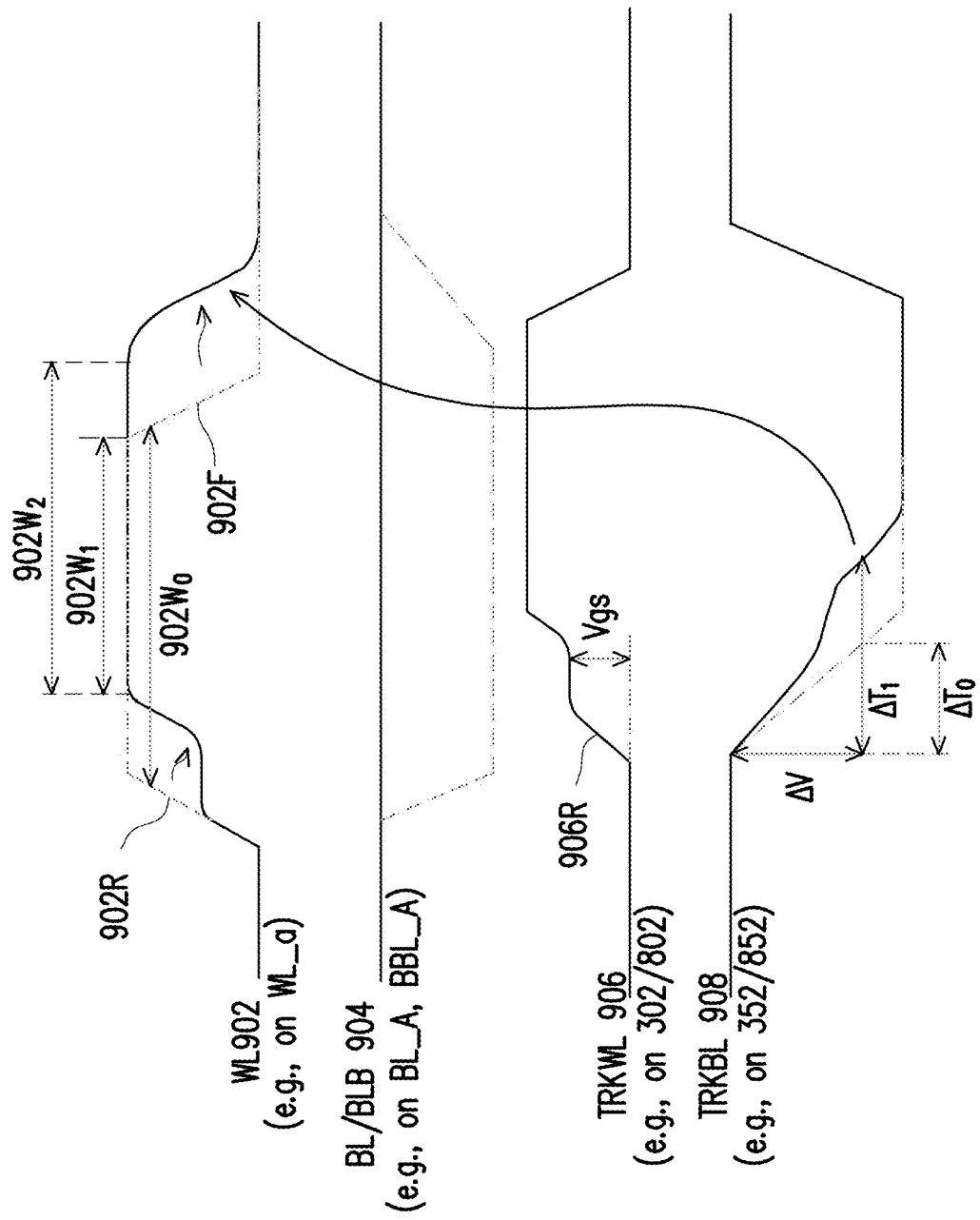
FIG. 9 illustrates example signals present on a WL of a memory array, BL/BBL of the memory array, a tracking WL of a tracking WL circuit, and a tracking BL of a tracking BL circuit, respectively, in accordance with some embodiments.

FIG. 9 illustrates example signals present on a WL of a memory array (hereinafter "WL signal 902"), BL/BBL of the memory array (hereinafter "BL signal 904"), a tracking WL (hereinafter "TRKWL signal 906"), and a tracking BL (hereinafter "TRKBL signal 908"), respectively, in accordance with various embodiments. The WL signal 902, BL signal 904, TRKWL signal 906, and TRKBL signal 908 shown in FIG. 9 may represent signals respectively present on the WL, BL/BBL, tracking WL, and tracking BL described above with respect to FIGS. 1-8.

Using FIGS. 3 and 8 as a representative example, when memory cell 200-1 is selected to be written, the WL signal 902 present on WL_a can be a pulse signal, which includes a rising edge 902R and a falling edge 902F. When the WL signal 902 reaches a high logic state along the rising edge 902R, WL_a is asserted thereby activating all the memory cells disposed along row a (e.g., 200-1, 200-2, 200-3). By pulling up or down the BL_A according to a logic state to be written to memory cell 200-1, while performing dummy read operation to all the unselected memory cells, the write operation can be performed on the selected memory cell 200-1. Ideally, the rising edge 902R of the WL signal 902 shall present a smooth slope, as shown in dotted line of FIG. 9. However, due to WL-BL capacitive coupling largely from the unselected memory cells (e.g., coupling from BL_B/BBL_B to WL_a, coupling from BL_C/BBL_C to WL_a), the rising edge 902R may be deteriorated to have a decreased slope, as shown in solid line of FIG. 9. As such, a pulse width, $902W_1$, of the WL signal 902, defined by the deteriorated rising edge 902R (shown in solid line) and the original falling edge 902F (shown in dotted line), may be significantly reduced, when compared to an original pulse width, $902W_0$, defined by the original rising edge 902R (shown in dotted line) and the original falling edge 902F (shown in dotted line).

By directly coupling the BLs/BBLs of memory array 200 to tracking WL circuit 300, as shown in FIG. 3, tracking WL circuit 300 can emulate the deteriorated WL signal 902 to present, on tracking WL 302, the TRKWL signal 906 with a deteriorated slope on its rising edge. For example, by emulating the deteriorated WL signal 902, the TRKWL signal 906 can have a rising edge 906R with a deteriorated (e.g., decreased) slope. Referring now to FIG. 8, based on the TRKWL signal 906 present on tracking WL 802 (an example of tracking WL 302 of FIG. 3), each of tracking BL cells 854a-c can be turned on. For example, when the TRKWL signal 906 transitions to a high logic state, each of the tracking BL cells 854a-c is turned on, and the precharged tracking BL 852 can start being discharged to a low logic state. As shown in FIG. 9, in response to being discharged, the TRKBL signal 908 transitions from a high logic state to a low logic state. When the TRKBL signal 908 transitions to a low enough voltage (e.g., dropped by a predefined ΔV), the WL signal 902 is configured to transition to a low logic state along the falling edge 902F (i.e., about when the falling edge 902F occurs or a timing of the falling edge 902F).

Due to the deteriorated slope of the rising edge 906R, a voltage across the gate and source (Vgs) of the access transistor (e.g., 856) of each of the tracking BL cells 854a-c is reduced, which causes a current, I, flowing through the tracking BL 852 to be reduced. As such, the time, $\Delta T_1$, for the TRKBL signal 908 to drop ΔV (shown in solid line) is extended from the time, $\Delta T_0$, for the TRKBL signal 908 to drop ΔV (shown in dotted line). In other words, a discharging rate of the TRKBL signal 908 is reduced. This is because $I \times \Delta T_1$ (or $I \times \Delta T_0$) is a constant value determined by a product of a capacitance value of the tracking BL 852 and the predefined ΔV. Consequently, the falling edge 902F of the WL signal 902 can also be extended, which can recover the pulse width of the WL signal 902 from $902W_1$ to become $902W_2$. When the WL signal 902 is recovered, despite the WL-BL capacitive coupling resulting from the unselected memory cells, the selected memory cell (e.g., memory cell 200-1 in the above example) can still have ample time to finish the write operation.

Each of the combinations of the tracking WL circuit and tracking BL circuit described with respect to FIGS. 4-7C can follow the same principle to recover the pulse width of a deteriorated WL signal, in accordance with various embodiments.

For example in any of FIGS. 5-6, by coupling replica tracking BL 556 of tracking BL circuit 550 to tracking WL circuit 500, tracking WL circuit 500 can emulate the deteriorated WL signal 902 to present, on tracking WL 502, the TRKWL signal 906. Specifically, replica tracking BL 556, configured to emulate the BLs/BBLs of memory array 200, is pre-charged to a high logic state by transistor 504 prior to the TRKWL signal 906 transitioning to a high logic state. Concurrently with the TRKWL signal 906 transitioning to the high logic state, transistor 508 and transistor 504 can be turned on and off, respectively. As such, replica tracking BL 556 may start being discharged toward ground through transistor 508, which can cause the TRKWL signal 906 to emulate the deteriorated WL signal 902, thereby having a deteriorated slope on its rising edge. Based on the principle discussed above, a discharging rate of the TRKBL signal 908 (present on tracking BL 552 in FIG. 5 or 852 in FIG. 8) can be reduced, thereby recovering the pulse width of the WL signal 902.

For example in any of FIGS. 7A-C, by coupling replica tracking BL 756 of tracking BL circuit 750 to tracking WL circuit 700, tracking WL circuit 700 can emulate the deteriorated WL signal 902 to present, on tracking WL 702, the TRKWL signal 906. Specifically, replica tracking BL 756, configured to emulate the BLs/BBLs of memory array 200, is coupled to tracking WL 704, which presents logically inverted signals with respect to tracking WL 702. In some embodiments, tracking WL 704 can disturb tracking WL 702 by the one or more capacitors formed (e.g., effectively induced or physically disposed) therebetween. As such, the deteriorated WL signal 902 can be emulated as the TRKWL signal 906 (present on tracking WL 702) that is also characterized with a deteriorated slope on its rising edge. Based on the principle discussed above, a discharging rate of the TRKBL signal 908 (present on tracking BL 752 in FIGS. 7A-C or 852 in FIG. 8) can be reduced, thereby recovering the pulse width of the WL signal 902.

When writing a logic state to a memory cell, the reduced pulse width of a WL signal (e.g., due to its rising edge being deteriorated) can negatively impact the write operation. For example, if the pulse width is reduced to be too short, the write operation can fail. Typically, a figure-of-merit referred to as "write margin" is used to assess a memory device's write operation performance. The write margin of a memory cell is typically defined as a time duration from when the memory cell is successfully written into a logic state to when the falling edge of a corresponding WL signal occurs. By using the various tracking WL circuits and tracking BL circuits, as disclosed herein, to recover the pulse width of a deteriorated WL signal, a corresponding write margin can be significantly improved.

Figure 10:
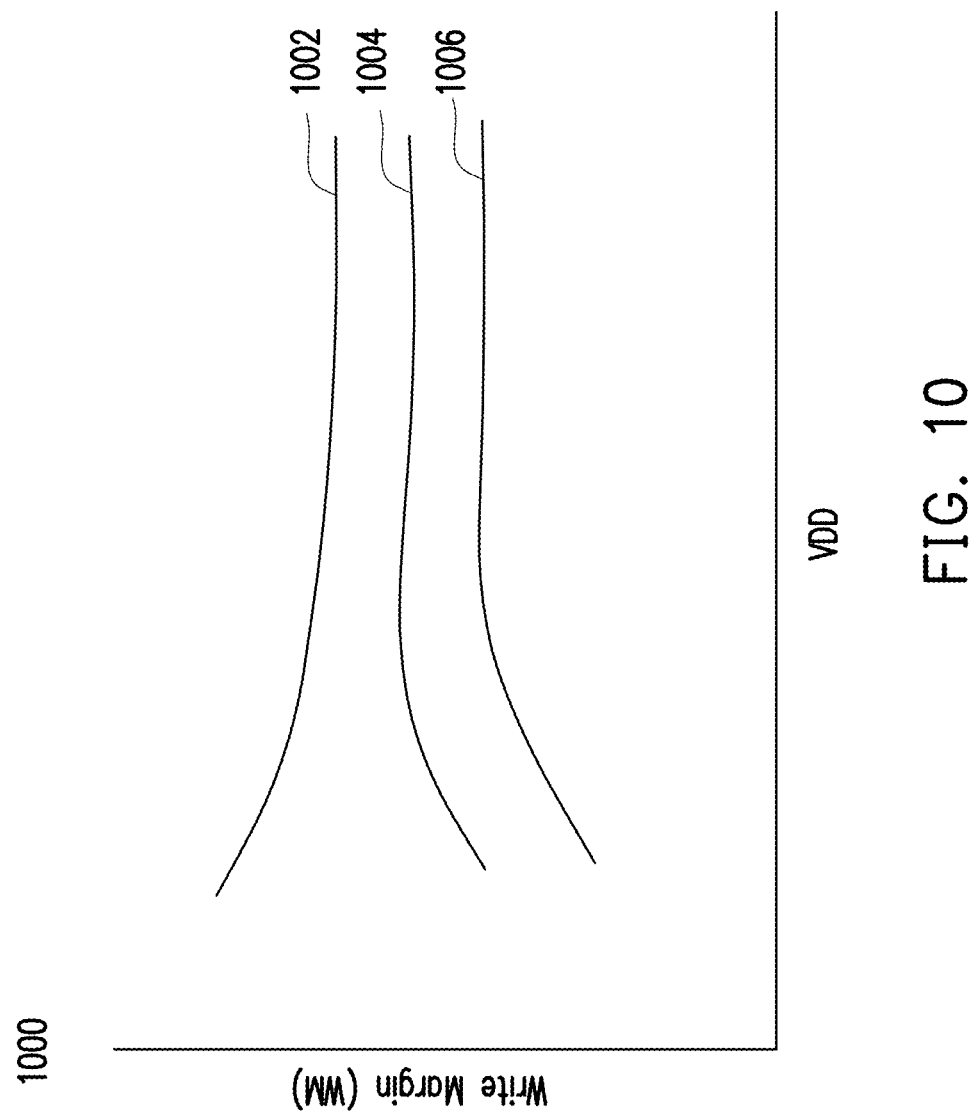
FIG. 10 illustrates a diagram comparing respective write margins of different memory devices, in accordance with some embodiments.

FIG. 10 illustrates a diagram 1000 to compare the write margins of different memory devices. For example, diagram 1000 compares the write margins (the Y axis) of a first memory device, a second memory device, and a third different memory device under various operation conditions, e.g., power supply, VDD (the X axis). The first memory device represents a reference device that has no WL-BL coupling effect. The trend of write margins versus operation conditions for the first memory device is shown as plot 1002. The second memory device represents a device that has WL-BL coupling effect and uses at least one of the combinations of the tracking WL circuit and the tracking BL circuit, as described above. The trend of write margins versus operation conditions for the second memory device is shown as plot 1004. The third memory device represents a device that has WL-BL coupling effect and does not use any of the combinations of the tracking WL circuit and the tracking BL circuit, as described above. The trend of write margins versus operation conditions for the third memory device is shown as plot 1006. As shown, over a certain range of the operation conditions, plot 1004 globally presents substantially greater writes than plot 1006.

Figure 11:
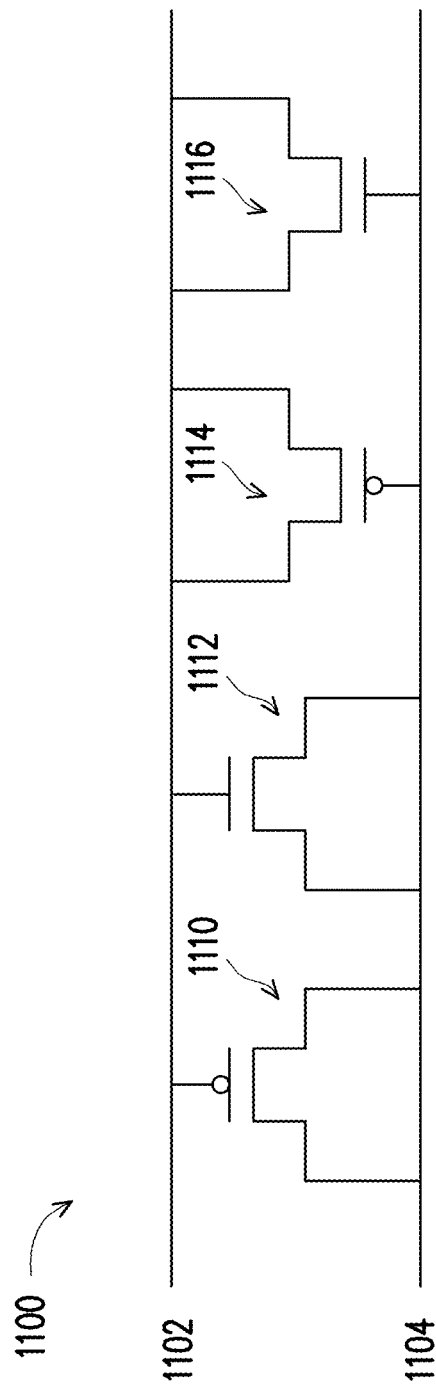
FIG. 11 illustrates an example implementation of a capacitor coupled between two metal lines, in accordance with some embodiments.

FIG. 11 illustrates an example implementation 1100 of a capacitor coupled between two metal lines, for example, capacitor 506 coupled between replica tracking BL 556 and tracking WL 502 (FIG. 5), capacitor 606 coupled between replica tracking BL 656 and tracking WL 602 (FIG. 6), and capacitor 706 coupled between tracking WL 702 and tracking WL 704 (FIGS. 7A-C). As shown in FIG. 11, the capacitor, coupled between two metal lines (e.g., metal line 1102 and metal line 1104), can be formed by at least one of: transistor 1110, transistor 1112, transistor 1114, or transistor 1116. In some embodiments, transistors 1110 and 1114 can each include a pMOSFET, and transistors 1112 and 1116 can each include an nMOSFET, while each of the transistors 1110-1116 can include any of various other transistor. Each of the transistors 1110-1116 has its gate connected to one of the metal lines 1102-1104 and its source and drain commonly connected to the other of the metal lines 1102-1104.

As a representative example, transistor 1110 can function as capacitor 506 with (i) transistor 1110's gate connected to metal line 1102; and (ii) transistor 1110's source and drain commonly connected to metal line 1104. In some embodiments, metal lines 1102 and 1104 can correspond to replica tracking BL 556 and tracking WL 502, respectively.

Figure 12:
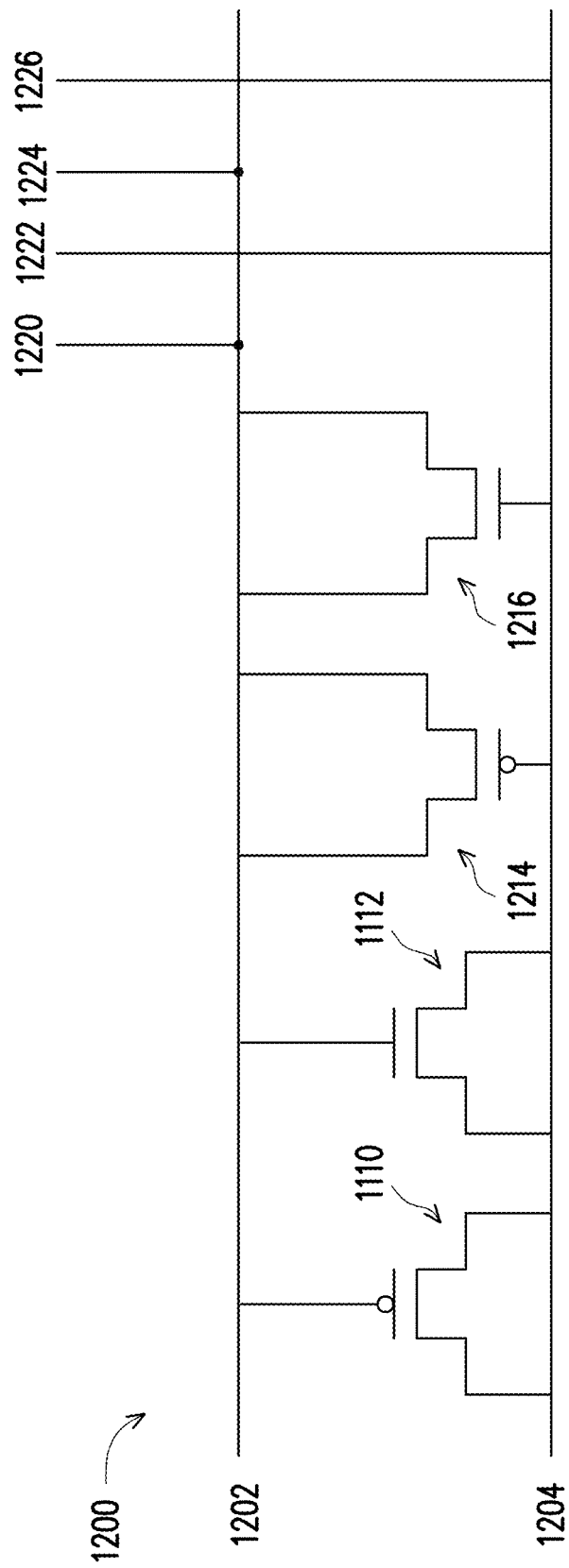
FIG. 12 illustrates another example implementation of a capacitor coupled between two metal lines, in accordance with some embodiments.

FIG. 12 illustrates another example implementation 1200 of a capacitor coupled between two metal lines, for example, capacitor 506 coupled between replica tracking BL 556 and tracking WL 502 (FIG. 5), capacitor 606 coupled between replica tracking BL 656 and tracking WL 602 (FIG. 6), and capacitor 706 coupled between tracking WL 702 and tracking WL 704 (FIGS. 7A-C). As shown in FIG. 12, the capacitor, coupled between two metal lines (e.g., metal line 1202 and metal line 1204), can be formed by a combination of (i) at least one of: transistor 1210, transistor 1212, transistor 1214, or transistor 1216 and (ii) one or more metal lines 1220, 1222, 1224, and 1226. In some embodiments, transistors 1210 and 1214 can each include a pMOSFET, and transistors 1212 and 1216 can each include an nMOSFET, while each of the transistors 1210-1216 can include any of various other transistor. Each of the transistors 1210-1216 has its gate connected to one of the metal lines 1202-1204 and its source and drain commonly connected to the other of the metal lines 1202-1204.

As a representative example, the combination of transistor 1210 and one or more of the metal lines 1220-1226 can function as capacitor 506 with (i) transistor 1210's gate connected to metal line 1202; (ii) transistor 1210's source and drain commonly connected to metal line 1204; and (iii) at least one of: metal line 1220 connected to metal line 1202, metal line 1222 connected to metal line 1204, metal line 1224 connected to metal line 1202, or metal line 1226 connected to metal line 1204. In some embodiments, metal lines 1202 and 1204 can correspond to replica tracking BL 556 and tracking WL 502, respectively.

In general, a first metal layer (also referred to as a metal 1 (M1) layer) is generally the lowest metal layer in an integrated circuit. That is, the metal 1 layer is the metal layer closest to a substrate on which the metal layers are formed. A second metal layer (also referred to as a metal 2 (M2) layer) is the metal layer formed above the metal 1 layer without any other metal layer between the metal 1 layer and the metal 2 layer. Likewise, a third metal layer (also referred to as the metal 3 (M3) layer) is the next metal layer formed above the metal 2 layer without any other metal layer between the metal 2 layers and the metal 3 layer. Similarly, a fourth metal layer (also referred to as the metal 4 (M4) layer) is the next metal layer formed above the metal 3 layer without any other metal layer between the metal 3 layers and the metal 4 layer. The progression of metal layers continues in this fashion until a top metal layer is formed, for example, the eighth metal layer (also referred to as metal 8 (M8) layer) formed above a seventh metal layer (also referred to as metal 7 (M7) layer) without any other metal layer between the metal 7 layer and the metal 8 layer. It is to be understood that the disclosure is not limited to any specific number of metal layers.

Figure 13:
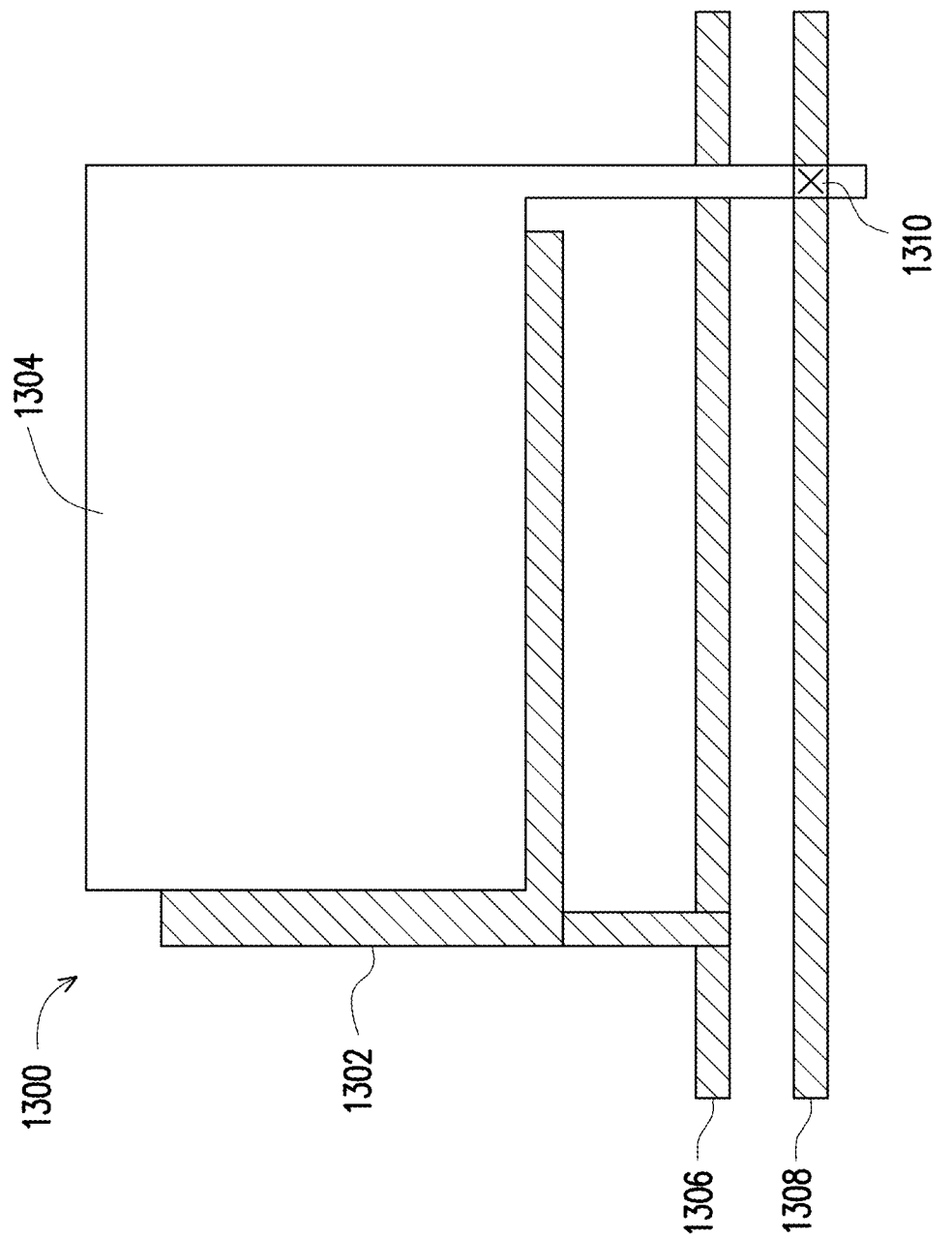
FIG. 13 illustrates yet another example implementation of a capacitor coupled between two metal lines, in accordance with some embodiments.

FIG. 13 illustrates yet another example implementation 1300 of a capacitor coupled between two metal lines, for example, capacitor 506 coupled between replica tracking BL 556 and tracking WL 502 (FIG. 5), capacitor 606 coupled between replica tracking BL 656 and tracking WL 602 (FIG. 6), and capacitor 706 coupled between tracking WL 702 and tracking WL 704 (FIGS. 7A-C).

In example implementation 1300, the capacitor are formed using two substantially parallel metal plates in two metal layers separated by a dielectric material. A first metal plate of the two substantially parallel metal plate is formed in a first metal layer. A second metal plate of the two substantially parallel metal plates is formed in a second metal layer different from the first metal layer of the first metal plate. A capacitance value in example implementation 1300 is varied by varying dimensions of the metal plates.

For example in FIG. 13, a first metal plate 1302 and a second metal plate 1304 substantially parallel to first metal plate 1302 are depicted. First metal plate 1202 is formed in the metal 3 (M3) layer and second metal plate 1304 is formed in the metal 4 (M4) layer. First metal plate 1302 is connected to a first metal line 1306 and second metal plate 1304 is connected to a second metal line 1308 through a via 1310. Hereinafter, a via may be denoted by symbol "X" in the following figures. A capacitor can be formed by such metal plates 1302 and 1304. A capacitance value in example implementation 1300 is configurable to a desired capacitance value by configuring dimensions of first metal plate 1302 and second metal plate 1304. As a representative example, capacitor 506 can be formed by metal plates 1302 and 1304. In some embodiments, metal lines 1306 and 1308 can correspond to replica tracking BL 556 and tracking WL 502, respectively.

First metal line 1306 and second metal line 1308 are also formed in the metal 3 layer. Second metal plate 1304 is substantially parallel to first metal plate 1302 and is separated from first metal plate 1302 by a predetermined gap. In example embodiments, the predetermined gap can be filled with a dielectric material. The dielectric material may include a polymer such as polybenzoxazole (PBO), polyimide, benzocyclobutene (BCB), or the like; a nitride such as silicon nitride or the like; an oxide such as silicon oxide, PhosphoSilicate Glass (PSG), BoroSilicate Glass (BSG), Boron-doped PhosphoSilicate Glass (BPSG), or the like; the like, or a combination thereof.

However, other types of dielectric materials are within scope of the disclosure. Although first metal plate 1302 is shown to be formed in the metal 3 layer and second metal plate 1304 is shown to be formed in the metal 4 layer, other metal layers are within scope of the disclosure for both first metal plate 1302 and second metal plate 1304. In addition, although first metal line 1306 and second metal line 1308 are shown be formed in the same metal layer as first metal plate 1302 (e.g., the metal 3 layer), in some other embodiments, first metal line 1306 and second metal line 1308 can be formed in the same metal layer as second metal plate 1304 (e.g., the metal 4 layer). Dimensions and shapes of each of first metal plate 1302 and second metal plate 1304 can be based on a desired capacitance value.

Figure 14:
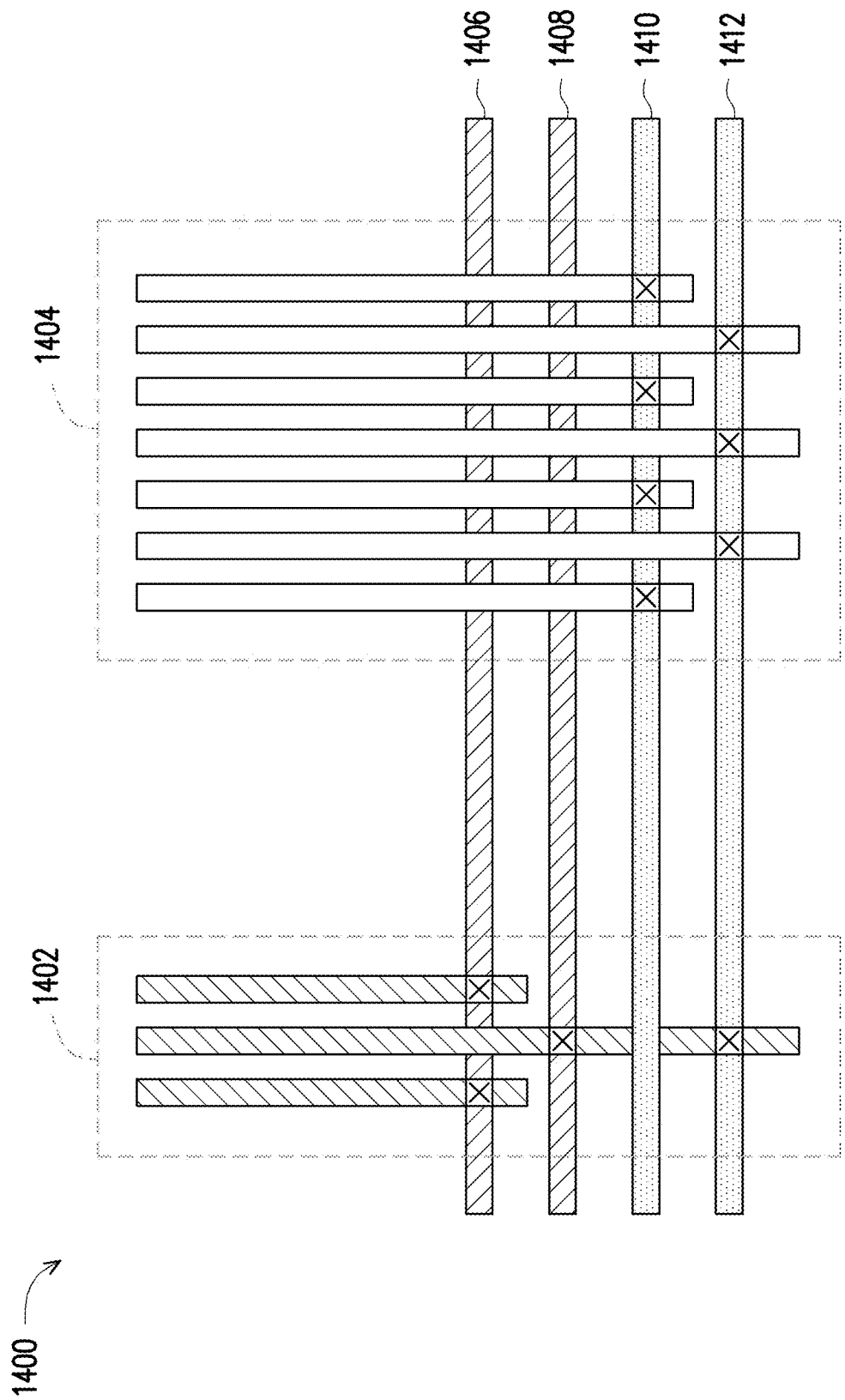
FIG. 14 illustrates yet another example implementation of a capacitor coupled between two metal lines, in accordance with some embodiments.

FIG. 14 illustrates yet another example implementation 1400 of a capacitor coupled between two metal lines, for example, capacitor 506 coupled between replica tracking BL 556 and tracking WL 502 (FIG. 5), capacitor 606 coupled between replica tracking BL 656 and tracking WL 602 (FIG. 6), and capacitor 706 coupled between tracking WL 702 and tracking WL 704 (FIGS. 7A-C).

Example implementation 1400, which is also referred to as hand clasping style, includes two sub-capacitors, that is a first sub-capacitor and a second sub-capacitor, formed in parallel to each other. The two sub-capacitors are formed from two sets of metal stripes. For instance, a first sub-capacitor is formed from a first set of metal stripes and a second sub-capacitor is formed parallel to the first sub-capacitor from a second set of metal stripes. First set of metal stripes are placed parallel to each other thereby forming a capacitor between each two consecutive metal stripes. Similarly, second set of metal stripes are also placed parallel to each other thereby forming a capacitor between each two consecutive metal stripes. A capacitance value of each of the two sub-capacitors is dependent on a number of metal stripes and dimensions of metal stripes in each corresponding set of metal stripes and a length of each metal stripes. An overall capacitance value in example implementation 1400 is determined as sum of the two sub-capacitors formed by the two set of metal stripes.

For example in FIG. 14, example implementation 1400 includes a first sub-capacitor formed from a first set of metal stripes 1402 and a second sub-capacitor formed from a second set of metal stripes 1404. Each of a first set of metal stripes 1402 and second set of metal stripes 1404 are formed in two different metal layers. For example, first set of metal stripes 1402 are formed in the metal 2 (M2) layer and second set of metal stripes 1404 formed in the metal 4 (M4) layer. However, other metal layers are within the scope of disclosure. The first sub-capacitor is formed between a first pair of metal lines (e.g., a first metal line 1406 and a second metal line 1408). Each of the first metal line 1406 and second metal line 1408 are formed in the metal 1 (M1) layer. Each of first set of metal stripes 1402 are connected to first metal line 1406 or second metal line 1408 in alternate through a via. Second sub-capacitor is formed between a second pair of metal lines (e.g., a third metal line 1410 and a fourth metal line 1412). Each of third metal line 1410 and fourth metal line 1412 are formed in the metal 3 (M3) layer. Each of second set of metal stripes 1404 are connected to third metal line 1410 or fourth metal line 1412 in alternate through a via. As a representative example, capacitor 506 can include at least one of the first sub-capacitor or the second sub-capacitor. In some embodiments, metal lines 1406 and 1410 can correspond to replica tracking BL 556, and metal lines 1408 and 1412 can correspond to tracking WL 502.

Each of first set of metal stripes 1402 and second set of metal stripes 1404 include a predetermined number of metal stripes placed parallel to each other. A capacitor can be additionally formed between each two consecutive metal stripes on top of the first sub-capacitor and the second sub-capacitor. In the above representative example, in addition to the first sub-capacitor and/or the second sub-capacitor, capacitor 506 can further include such additional capacitor. A total capacitance value for each of first set of metal stripes 1402 and second set of metal stripes 1404, thus, is dependent upon a number of metal stripes and dimensions of metal stripes in a corresponding set. For example in FIG. 14, first set of metal stripes 1402 includes three metal stripes and second set of metal stripes 1404 includes seven metal stripes. However, a number of metal stripes for each of first set of metal stripes 1402 and second set of metal stripes 1404 may vary based on a desired capacitance value of each of the first sub-capacitor and the second sub-capacitor. Hence, a different number of metal stripes for each of first set of metal stripes 1402 and second set of metal stripes 1404 is within the scope of the disclosure. In addition, the dimensions of each metal stripes of first set of metal stripes 1402 and second set of metal stripes 1404 may also vary based on a desired capacitance value of the first sub-capacitor and the second sub-capacitor.

In example implementations, each metal stripes of first set of metal stripes 1402 are parallel to each other with gaps between the stripes being filled with a dielectric material. Similarly, each metal stripes of second set of metal stripes 1404 are parallel to each other with gaps between the stripes being filled with a dielectric material. An example dielectric material can include a polymer such as polybenzoxazole (PBO), polyimide, benzocyclobutene (BCB), or the like; a nitride such as silicon nitride or the like; an oxide such as silicon oxide, PhosphoSilicate Glass (PSG), BoroSilicate Glass (BSG), Boron-doped PhosphoSilicate Glass (BPSG), or the like; the like, or a combination thereof. However, other dielectric materials are within scope of the disclosure.

Figure 15:
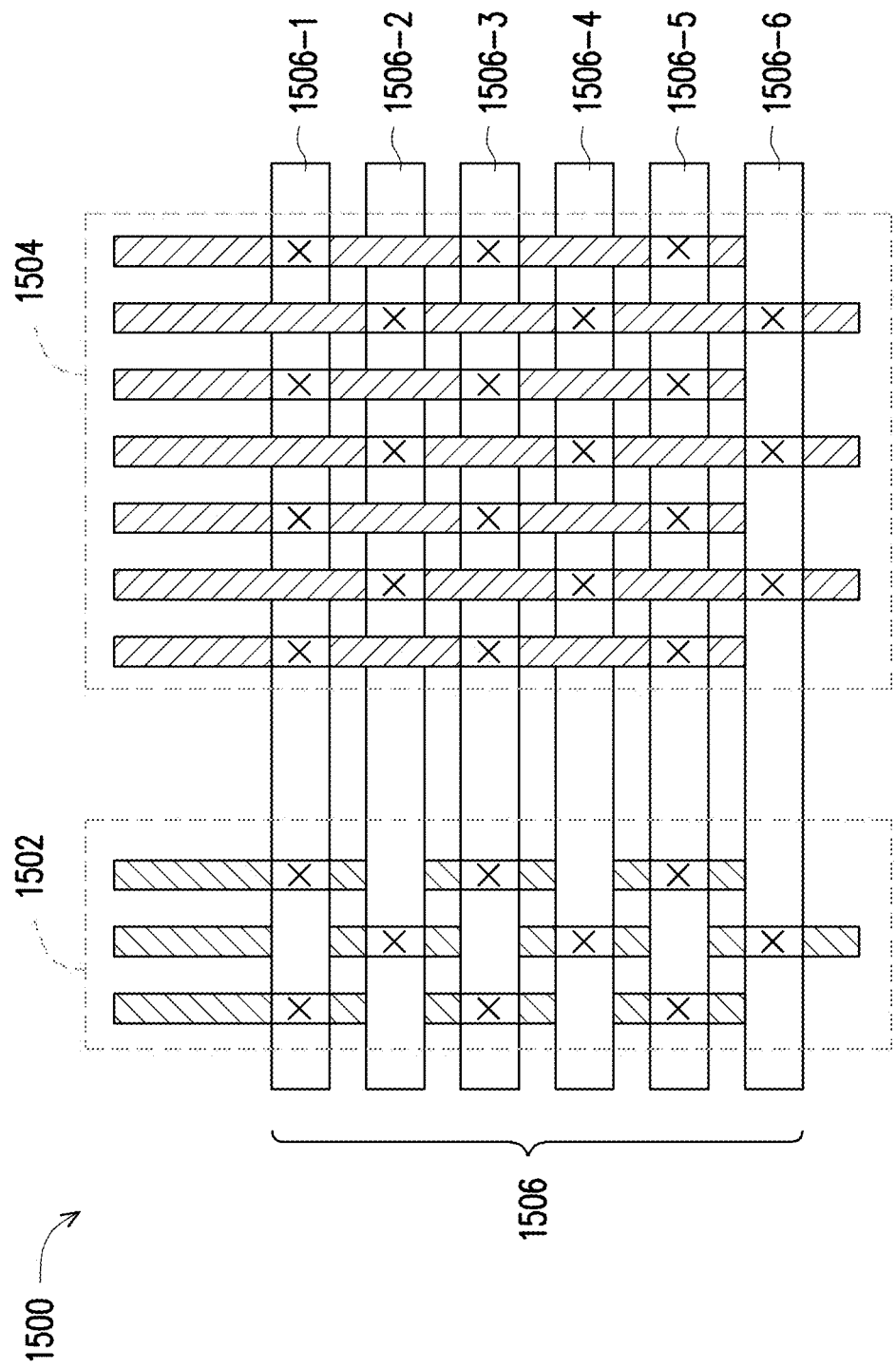
FIG. 15 illustrates yet another example implementation of a capacitor coupled between two metal lines, in accordance with some embodiments.

FIG. 15 illustrates yet another example implementation 1500 of a capacitor coupled between two metal lines, for example, capacitor 506 coupled between replica tracking BL 556 and tracking WL 502 (FIG. 5), capacitor 606 coupled between replica tracking BL 656 and tracking WL 602 (FIG. 6), and capacitor 706 coupled between tracking WL 702 and tracking WL 704 (FIGS. 7A-C).

Example implementation 1500, which is also referred to as a grid style, includes three sets of metal stripes. Each of the three sets of metal stripes form three sub-capacitors. For example, a first sub-capacitor is formed from a first set of metal stripes placed parallel to each other, a second sub-capacitor is formed from a second set of metal stripes placed parallel to each other, and a third sub-capacitor is formed from a third set of metal stripes placed parallel to each other. Each successive metal stripe of each of the first set of metal stripes and the second set of metal stripes are connected to metal stripes of the third set of metal stripes in alternate thereby forming a grid. A capacitance value of each of the three sub-capacitors is dependent on a number of metal stripes in each corresponding set of metal stripes and dimensions of each metal stripes. An overall capacitance value in example implementation 1500 is determined as sum of the three sub-capacitors formed by the three sets of metal stripes.

For example in FIG. 15, implementation 1500 includes a first set of metal stripes 1502, a second set of metal stripes 1504, and a third set of metal stripes 1506 (e.g., 1506-1, 1506-2, 1506-3, 1506-4, 1506-4, 1506-5, 1506-6). Third metal set of stripes 1506 may be placed in a first direction, and first set of metal stripes 1502 and second set of metal stripes 1504 may each be formed in a second direction. The second direction may be orthogonal to the first direction. Each metal stripe of first set of metal stripes 1502 and each metal stripe of second set of metal stripes 1504 are connected to each alternate metal stripe of third set of metal stripes 1506 through a via to form a grid. That is, a first metal stripe of each of first set of metal stripes 1502 and second set of metal stripes 1504 is connected to a second, fourth, sixth, . . . , metal stripe of third set of metal stripes 1506 (1506-2, 1506-4, 1506-6). And, a second metal stripe of each of first set of metal stripes 1502 and second set of metal stripes 1504 is connected to a first, third, fifth, . . . , metal stripe of third set of metal stripes 1506 (1506-1, 1506-3, 1506-5).

The first sub-capacitor is formed by one or more pairs of first set of metal stripes 1502; the second sub-capacitor is formed by one or more pairs of second set of metal stripes 1504; and the third sub-capacitor is formed by one or more pairs of third set of metal stripes 1506. A capacitance value for each of the first sub-capacitor formed by first set of metal stripes 1502, the second sub-capacitor formed by second set of metal stripes 1504 and the third sub-capacitor formed by third set of metal stripes 1506 is dependent upon a number of metal stripes in each set and dimensions of each metal stripes. Hence, each of first set of metal stripes 1502, second set of metal stripes 1504, and third set of metal stripes 1506 include a predetermined number of metal stripes.

For example in FIG. 15, first set of metal stripes 1502 includes three metal stripes, second set of metal stripes 1504 includes seven metal stripes, and third set of metal stripes 1506 includes six metal stripes. However, a number of metal stripes in each of first set of metal stripes 1502, second set of metal stripes 1504, and third set of metal stripes 1506 may vary based on a desired capacitance value. Hence, a different number of metal stripes for each of first set of metal stripes 1502, second set of metal stripes 1504, and third set of metal stripes 1506 is within the scope of the disclosure. In addition, a dimension of the metal stripes in each of first set of metal stripes 1502, second set of metal stripes 1504, and third set of metal stripes 1506 may vary based on a desired capacitance value. As a representative example, capacitor 506 can include at least one of the first sub-capacitor, the second sub-capacitor, or the third sub-capacitor. Accordingly, one of third set of metal stripes 1506 (e.g., 1506-5) can correspond to replica tracking BL 556, and another of third set of metal stripes 1506 (e.g., 1506-6) can correspond to tracking WL 502.

Each metal stripe of first set of metal stripes 1502 are parallel to each other with gaps between the metal stripes being filled with a dielectric material. Similarly, each metal stripes of second set of metal stripes 1504 are parallel to each other with gaps between the stripes being filled with a dielectric material. Additionally, each metal stripes of third set of metal stripes 1506 are parallel to each other with gaps between the stripes being filled with a dielectric material. An example dielectric material can include a polymer such as polybenzoxazole (PBO), polyimide, benzocyclobutene (BCB), or the like; a nitride such as silicon nitride or the like; an oxide such as silicon oxide, PhosphoSilicate Glass (PSG), BoroSilicate Glass (BSG), Boron-doped PhosphoSilicate Glass (BPSG), or the like; the like, or a combination thereof. However, other dielectric materials are within scope of the disclosure.

In addition, each of first set of metal stripes 1502, second set of metal stripes 1504, and third set of metal stripes 1506 can be disposed in different metal layers. For example, first set of metal stripes 1502 are in the metal 2 (M2) layer, second set of metal stripes 1504 are in the metal 4 (M4) layer, and third set of metal stripes 1506 are in the metal 3 (M3) layer. However, other metal layers are within scope of the disclosure. In some implementations two of first set of metal stripes 1502, second set of metal stripes 1504, and third set of metal stripes 1506 can be in a same metal layer and the remaining being in a different metal layer. For example, the metal stripes of each of first set of metal stripes 1502 and second set of metal stripes 1504 can be in the metal 2 (M2) layer or metal 4 (M4) layer, and third set of metal stripes 1506 can be in the metal 3 (M3) layer.

Figure 16A:
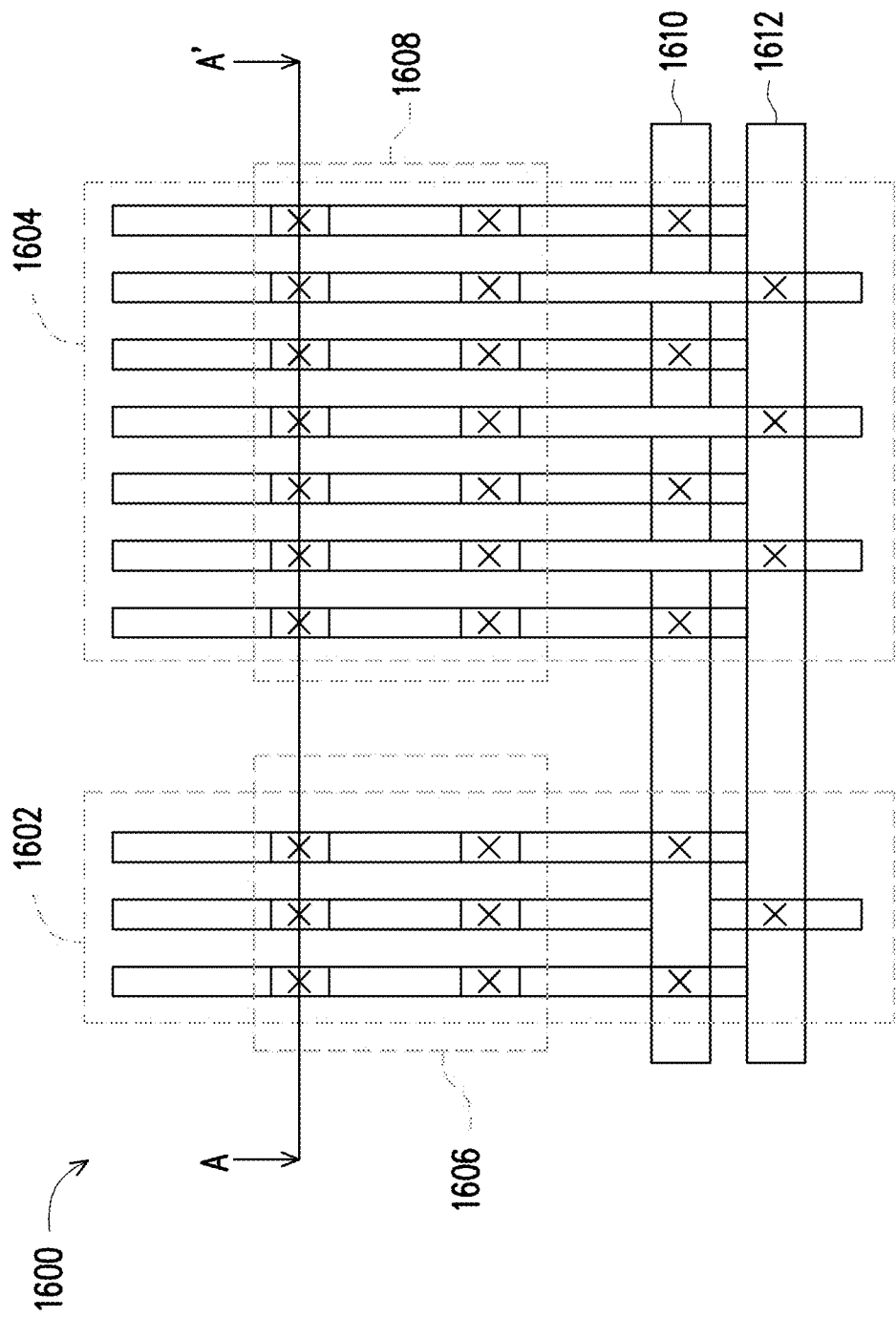
FIGS. 16A, 16B, and 16C illustrate yet another example implementation of a capacitor coupled between two metal lines, in accordance with some embodiments.
Figure 16B:
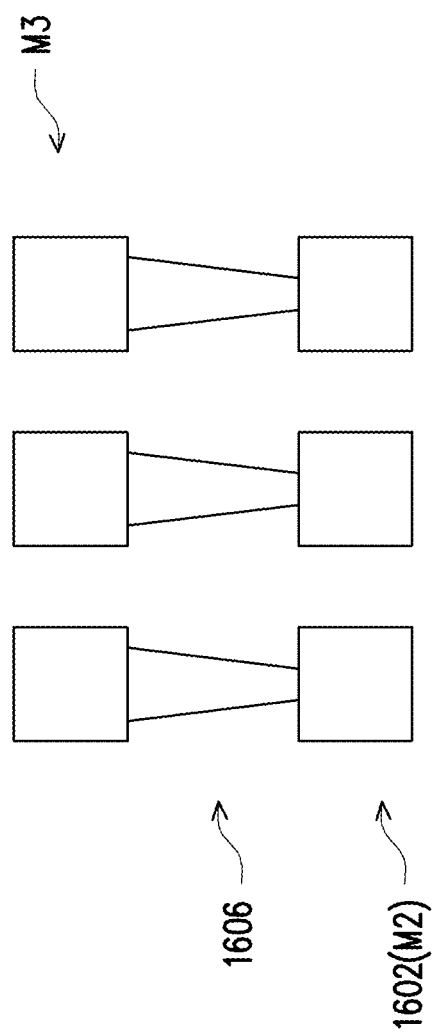
Figure 16C:
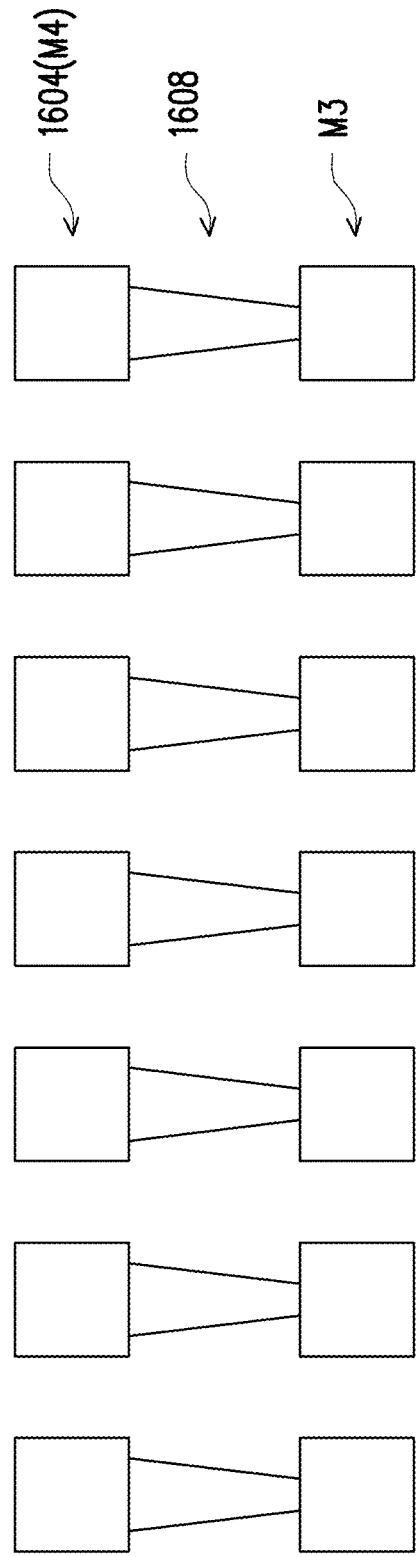

FIGS. 16A, 16B, and 16C illustrate yet another example implementation 1600 of a capacitor coupled between two metal lines, for example, capacitor 506 coupled between replica tracking BL 556 and tracking WL 502 (FIG. 5), capacitor 606 coupled between replica tracking BL 656 and tracking WL 602 (FIG. 6), and capacitor 706 coupled between tracking WL 702 and tracking WL 704 (FIGS. 7A-C).

Example implementation 1600, which is also referred to as a via style, includes two sets of metal stripe. In addition, example implementation 1600 includes a plurality of vias formed on the metal stripes. Each of the two sets of metal stripes form two sub-capacitors. For example, a first sub-capacitor is formed from a first set of metal stripes placed parallel to each other and a second sub-capacitor is formed from a second set of metal stripes placed parallel to each other. Moreover, additional capacitors are formed from the plurality of vias. For example, each of the two adjacent vias form a capacitor between them. A capacitance value of each of the two sub-capacitors is dependent on a number of metal stripes in each corresponding set of metal stripes, dimensions (e.g., a length, a width, and/or a thickness) of the metal stripes, a number of vias in each corresponding set of metal stripes, and dimensions (e.g., a length, a width, and/or a thickness) of each vias. An overall capacitance value in example implementation 1600 is determined as sum of the two sub-capacitors formed by the two set of metal stripes.

For example in FIG. 16A, example implementation 1600 includes a first set of metal stripes 1602 and a second set of metal stripes 1604. Each of first set of metal stripes 1602 and second set of metal stripes 1604 are in different metal layers. For example, first set of metal stripes 1602 are in the metal 2 (M2) layer and second set of metal stripes 1604 are in the metal 4 (M4) layer. However, other metal layers are within the scope of disclosure. In some other embodiments, each of first set of metal stripes 1602 and second set of metal stripes 1604 can be in the same metal layer.

Each of first set of metal stripes 1602 and second set of metal stripes 1604 include a predetermined number of metal stripes. For example in FIG. 16A, first set of metal stripes 1602 includes three metal stripes and second set of metal stripes 9604 includes seven metal stripes. However, a number of metal stripes may vary based on a desired capacitance value. Hence, a different number of metal stripes for each of first set of metal stripes 1602 and second set of metal stripes 1604 is within the scope of the disclosure.

First set of metal stripes 1602 includes a first plurality of vias 1606 and second set of metal stripes 1604 include a second plurality of vias 1608. Each pair of adjacent vias of first plurality of vias 1606 and second plurality of vias 1608 can additionally form a capacitor between them. Therefore, a number of vias in each of first plurality of vias 1606 and second plurality of vias 1608 can be adjusted to change a capacitance value of example implementation 1600.

Each metal stripe of first set of metal stripes 1602 and second set of metal stripes 1604 are connected to first metal line 1610 and second metal line 1612 in alternate. First metal line 1610 and second metal line 1612 are formed in a metal layer different from the metal layers in which first set of metal stripes 1602 and second set of metal stripes 1604 are respectively formed. For example, first metal line 1610 and second metal line 1612 are in the metal 3 (M3) layer. However, other metal layers are within the scope of disclosure.

FIG. 16B illustrates example cross-sectional view of first metal stripes 1602, cut along line A-A', which includes first plurality of vias 1606. As shown in FIG. 16B, first plurality of vias 1606 are formed between the metal 2 (M2) layer, where first set of metal stripes 1602 are formed, and the metal 3 (M3) layer, where first metal line 1610 and second metal line 1612 are formed. However, other metal layers are within the scope of the disclosure. FIG. 16C illustrates example cross-sectional view of second metal stripes 1604, cut along line A-A', which includes second plurality of vias 1608. As shown in FIG. 16C, second plurality of vias 1608 are formed between the metal 3 (M3) layer, where first metal line 1610 and second metal line 1612 are formed, and the metal 4 (M4) layer, where second set of metal stripes 1604 are formed. However, other metal layers are within the scope of the disclosure. Moreover, each of first plurality of metal stripes 1602 and second plurality of metal stripes 1604 is shown to include two rows of vias. However, different number of rows of vias are within the scope of the disclosure.

The first sub-capacitor is formed by one or more pairs of first set of metal stripes 1602; and the second sub-capacitor is formed by one or more pairs of second set of metal stripes 1604. A capacitance value for each of the first sub-capacitor formed by first set of metal stripes 1602, and the second sub-capacitor formed by second set of metal stripes 1604 is dependent upon a number of metal stripes in each set and dimensions of each metal stripes. Hence, each of first set of metal stripes 1602 and second set of metal stripes 1604 include a predetermined number of metal stripes. As a representative example, capacitor 506 can include at least one of the first sub-capacitor or the second sub-capacitor. Accordingly, first metal line 1610 can correspond to replica tracking BL 556, and second metal line 1612 can correspond to tracking WL 502.

In addition, dimensions of each metal stripes of first set of metal stripes 1602 and second set of metal stripes 1604 may also may vary based on a desired capacitance value. In example embodiments, each metal stripe of first set of metal stripes 1602 are parallel to each other with gaps between the stripes being filled with a dielectric material. Similarly, each metal stripe of second set of metal stripes 1604 are parallel to each other with gaps between the stripes being filled with a dielectric material. Examples of the dielectric material include a polymer such as polybenzoxazole (PBO), polyimide, benzocyclobutene (BCB), or the like; a nitride such as silicon nitride or the like; an oxide such as silicon oxide, PhosphoSilicate Glass (PSG), BoroSilicate Glass (BSG), Boron-doped PhosphoSilicate Glass (BPSG), or the like; the like, or a combination thereof. However, other dielectric materials are within scope of the disclosure.

Figure 17:
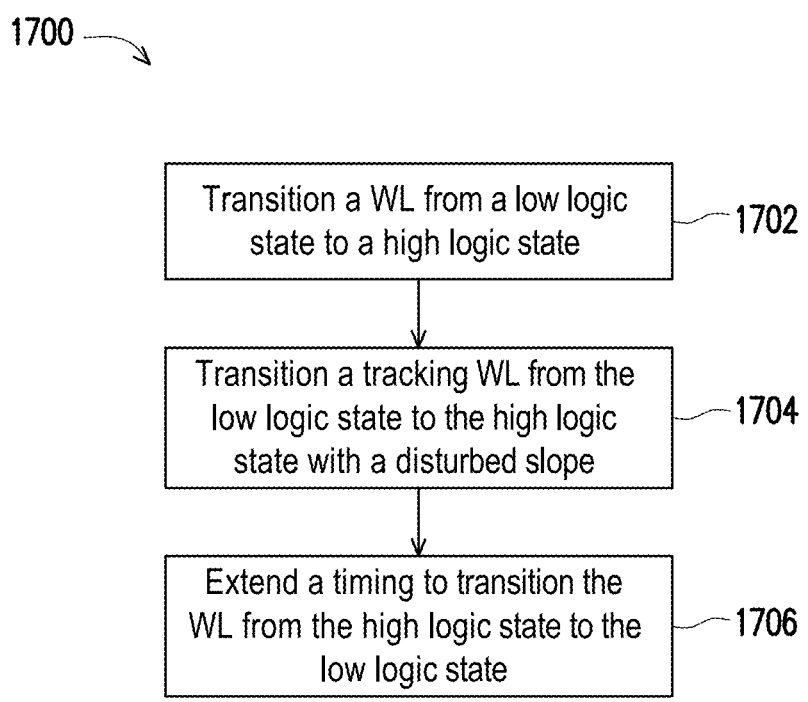
FIG. 17 illustrates a flow chart of an example method of operating a memory device to recover a word line pulse width, in accordance with various embodiments.

FIG. 17 illustrates a flow chart of an example method 1700 of operating a memory device to recover a word line pulse width, in accordance with various embodiments. For example, tracking WL circuit 204 and tracking BL circuit 202, as discussed with respect to FIGS. 1-16C, can perform the operations of the method 1700 to recover a word line pulse width. As such, the following embodiment of the method 1700 will be described in conjunction with FIGS. 1-16C. The illustrated embodiment of the method 1700 is merely an example. Therefore, it shall be understood that any of a variety of the operations of the method 1700 may be omitted, re-sequenced, and/or added while remaining within the scope of the present disclosure.

The method 1700 starts with operation 1702 of transitioning a WL coupled to a memory cell from a low logic state to a high logic state, in accordance with various embodiments. The memory cell may be selected to be written into a certain logic state. Referring again to FIG. 9, the WL signal 902 (e.g., WL_a of FIG. 2, when one of the memory cells 200-1-3 on row a is selected) may represent a signal present on the WL that transitions from the low logic state to the high logic state. Due to the effect of WL-BL coupling from the BL/BBL of the selected memory cell and/or the BLs/BBLs of one or more of unselected memory cells that arranged along the WL, the WL signal 902 may have a deteriorated slope on its rising edge 902R.

The method 1700 continues to operation 1704 of transitioning a tracking WL that emulate the WL from the low logic state to the high logic state with a disturbed slope by at least one of: (i) coupling the tracking WL directly to a BL coupled to the memory cell or (ii) coupling the tracking WL to a first tracking BL that emulates the BL, in accordance with various embodiments. For example in FIGS. 3-4, by respectively coupling tracking WL 302/402 (of tracking WL circuit 204 of FIG. 2) to one or more of BLs/BBLs of memory array 200 (e.g., BL_A, BBL_A, BL_B, BBL_B, etc.), tracking WL 302/402 can present the TRKWL signal 906 (FIG. 9) with a deteriorated or otherwise disturbed slope. For example in FIGS. 5-7C, by respectively coupling tracking WL 502/602/702 (of tracking WL circuit 204 of FIG. 2) to replica tracking BL 556/656/756 (of tracking BL circuit 202 of FIG. 2), tracking WL 502/602/702 can also present the TRKWL signal 906 (FIG. 9) with a deteriorated or otherwise disturbed slope.

The method 1700 continues to operation 1706 of extending a timing to transition, from the high logic state to the low logic state, the WL by discharging, in accordance with the disturbed slope, a second tracking BL that emulates the BL, in accordance with various embodiments. Referring again to FIG. 8, by discharging tracking BL 852 (which can be an example of tracking BL 352, 452, 552, 652, 752 of FIGS. 3-7C) in accordance with the disturbed slope of the TRKWL signal 906 (FIG. 9), the timing of the WL signal 902 that transitions back to the low logic state can be extended. It is noted that tracking BL 852 is part of tracking BL circuit 202. In some embodiments, the WL may transition from the high logic state to the low logic state in response to a voltage of the second tracking BL being dropped by a predefined voltage. For example in FIG. 9, upon the TRKBL signal 908 drops by ΔV (which is postponed to occur), the WL signal 902 can transition from the high logic state to the low logic state, thereby extending a pulse width of the WL signal 902.

In one aspect of the present disclosure, a memory device includes a memory cell. The memory device includes a word line (WL), connected to the memory cell, that is configured to present a first WL pulse to allow the memory cell to be written into a logic state within the first WL pulse. The first WL pulse has a rising edge and a falling edge. The memory device includes a bit line (BL), connected to the memory cell, that is configured to write the logic state to the memory cell. The memory device includes a first tracking WL configured to emulate the WL to provide a second WL pulse having a rising edge with a disturbed slope. The memory device includes a first tracking BL, configured to emulate the BL, that is coupled to the first tracking WL such that the falling edge of the first WL pulse is extended based on the disturbed slope of the rising edge of the second WL pulse.

In another aspect of the present disclosure, a memory device includes a memory array including a plurality of memory cells. The memory device includes a word line (WL), connected to one of the plurality of memory cells, that is configured to provide a first WL pulse having a rising edge and a falling edge that define a pulse width of the first WL pulse. The memory device includes a first tracking WL, formed adjacent to the memory array, that is configured to provide, via being physically or operatively coupled to a bit line (BL) configured to write a logic state to the memory cell, a second WL pulse having a rising edge with a decreased slope. The memory device includes a first tracking BL, configured to emulate the BL, that is coupled to the first tracking WL such that the pulse width of the first WL pulse is increased based on the decreased slope of the rising edge of the second WL pulse.

In yet another aspect of the present disclosure, a method of operating a memory device includes transitioning, from a first logic state to a second logic state, a word line (WL) coupled to a memory cell. The method includes transitioning, from the first logic state to the second logic state, a tracking WL that emulate the WL with a disturbed slope by at least one of: (i) coupling the tracking WL directly to a bit line (BL) coupled to the memory cell or (ii) coupling the tracking WL to a first tracking BL that emulates the BL. The method includes extending a timing to transition, from the second logic state to the first logic state, the WL by discharging, in accordance with the disturbed slope, a second tracking BL that emulates the BL.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating a memory device, comprising:
    transitioning, from a first logic state to a second logic state, a word line (WL) coupled to a memory cell;
    coupling a tracking WL to at least one of a bit line (BL) coupled to the memory cell or a first tracking BL emulating the BL, wherein the tracking WL emulates the WL with a decreased slope during a rising edge when transitioning from the first logic state to the second logic state responsive to the coupling; and discharging a second tracking BL emulating the BL according to the decreased slope.

2. The method of claim 1, wherein the first logic state is a low logic state and the second logic state is a high logic state.

3. The method of claim 1, further comprising:
transitioning the WL from the second logic state to the first logic state in response to a reduction of a voltage of the second tracking BL.

4. The method of claim 1, wherein during the transitioning of the WL from the first logic state to the second logic state, the WL provides a signal having the rising edge with a disturbed slope.

5. The method of claim 1, wherein responsive to coupling the tracking WL, the tracking WL transitions from the first logic state to the second logic state.

6. The method of claim 1, wherein responsive to coupling the tracking WL, the tracking WL provides a signal having a disturbed slope.

7. The method of claim 1, wherein responsive to discharging the second tracking BL according to the decreased slope, a timing to transition the WL from the second logic state to the first logic state is increased.

8. The method of claim 7, wherein the timing to transition corresponds to a duration when a voltage of the second tracking BL is reduced by a predefined value.

9. The method of claim 1, wherein a signal from at least one of the WL or the tracking WL corresponds to a pulse signal.

10. A memory device, comprising:
a memory cell;
a word line (WL) coupled to the memory cell;
a bit line (BL) coupled to the memory cell;
a tracking WL coupled to the BL, wherein the tracking WL emulates the WL with a decreased slope during a rising edge when the WL is transitioning from a first logic state to a second logic state responsive to coupling the tracking WL; and
a transistor coupled to the tracking WL and a tracking BL for discharging, wherein the tracking BL emulates the BL according to the decreased slope.

11. The memory device of claim 10, wherein the WL provides a first signal and the tracking WL provides a second signal, wherein the memory cell writes into a logic state within a duration of the first signal, and the BL writes the logic state to the memory cell.

12. The memory device of claim 11, wherein the first signal is extended according to the second signal, in response to coupling the tracking WL to the BL.

13. The memory device of claim 11, wherein the second signal corresponds to an emulation of a capacitive coupling between the WL and the BL.

14. The memory device of claim 11, wherein a voltage of the BL transitions to a low logic state in response to the rising edge of the second signal, and wherein the first signal provides a falling edge in response to the voltage of the BL reduced by a predefined value.

15. The memory device of claim 14, wherein the voltage of the BL provides a disturbed slope during transitioning to the low logic state according to a decreased slope of the rising edge of the second signal.

16. The memory device of claim 10, wherein the transistor to discharge the tracking BL comprises a gate coupled to the tracking WL, a drain coupled to the tracking BL, and a source coupled to a ground.

17. The memory device of claim 10, wherein the transistor decreases a voltage of the tracking BL to discharge the tracking BL, and wherein the discharge of the tracking BL decreases the rising edge slope of a signal from the tracking WL.

18. A memory device, comprising:
a memory cell;
a word line (WL) coupled to the memory cell, wherein the WL provides a first signal to transition from a first logic state to a second logic state;
a bit line (BL) coupled to the memory cell;
a tracking WL coupled to a first tracking BL emulating the BL, wherein the tracking WL provides a second signal and emulates the WL with a decreased slope during a rising edge when transitioning from the first logic state to the second logic state responsive to coupling the tracking WL; and
a transistor coupled to the tracking WL and a second tracking BL for discharging, wherein the second tracking BL emulates the BL according to the decreased slope.

19. The memory device of claim 18, wherein the first signal is extended according to the second signal, in response to coupling the tracking WL to the first tracking BL emulating the BL.

20. The memory device of claim 18, further comprising a capacitor coupling the second tracking BL and the first tracking WL, and wherein the first tracking WL includes at least one tracking WL bit cell, the tracking WL bit cell including a plurality of transistors, each gate of the plurality of transistors coupled to the first tracking WL, each source of the plurality of transistors is floated, and one of a plurality of drains of the plurality of transistors coupled to the BL.

* * * * *